(12) United States Patent
Peters et al.

(10) Patent No.: US 12,724,845 B2
(45) Date of Patent: Sep. 1, 2026

(54) DYNAMICALLY RECONFIGURABLE OVERSAMPLED CHANNELIZER

(71) Applicant: BAE SYSTEMS Information and Electronic Systems Integration Inc., Nashua, NH (US)

(72) Inventors: Christopher N. Peters, Nashua, NH (US); David D. Moser, Haymarket, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 1106 days.

(21) Appl. No.: 17/847,887

(22) Filed: Jun. 23, 2022

(65) Prior Publication Data

US 2023/0418898 A1 Dec. 28, 2023

(51) Int. Cl.

*G06F 17/14* (2006.01)
*H03H 17/02* (2006.01)
*H04B 1/18* (2006.01)

(52) U.S. Cl.

CPC ....... *G06F 17/142* (2013.01); *H03H 17/0223* (2013.01); *H04B 1/18* (2013.01)

(58) Field of Classification Search

CPC ....... G06F 17/141–142; H03H 17/0273–0279; H03H 17/0266–0267;

(Continued)

(56) References Cited

U.S. PATENT DOCUMENTS 6,792,057 B2 9/2004 Kabel et al.
6,990,060 B2 1/2006 Butash (Continued)

FOREIGN PATENT DOCUMENTS

EP 0819338 B1 7/1999
WO 2004059935 A1 7/2004

(Continued)

OTHER PUBLICATIONS

Analog, Devices Inc. Engineeri, Analog Devices Inc., and Devices Inc. Engineeri, Analog Devices Inc. Analog. Data Conversion Handbook, Elsevier Science & Technology, 2004. ProQuest Ebook Central, http://ebookcentral.proquest.com/lib/uspto-ebooks/detail.action?docID=226785. (Year: 2004).*

*Primary Examiner* — Andrew Caldwell
*Assistant Examiner* — Huy Duong
(74) *Attorney, Agent, or Firm* — Gary McFaline

(57) ABSTRACT

Techniques are provided for a dynamically reconfigurable two times (2×) oversampled channelizer. A channelizer implementing the techniques according to an embodiment includes a polyphase filter, a two phase reorder circuit, a fast Fourier transform (FFT) circuit, and a two phase merge circuit. The polyphase filter is configured to filter time domain input data to control spectral shaping of frequency bins of the channelizer output. The two phase reorder circuit is configured to split a 2× oversampled data stream into two parallel, critically sampled data streams. The FFT circuit is configured to transform each stream into the frequency domain. The two phase merge circuit is configured to merge the two streams of frequency domain data into a single stream of 2× oversampled frequency domain data for distribution onto frames of frequency bins. Reconfigurable parameters for the channelizer include filter coefficients, number of filter folds, and number of frequency bins.

15 Claims, 16 Drawing Sheets

(58) Field of Classification Search
CPC H03H 17/0223; H03H 2240/00; H04L 25/14; H04B 1/18
See application file for complete search history.

(56) References Cited

U.S. PATENT DOCUMENTS

| | | | | |
|---|---|---|---|---|
| 7,082,451 | B2 | 7/2006 | Kulkarni et al. | |
| 8,102,907 | B2 | 1/2012 | Kim | |
| 8,243,579 | B2 | 8/2012 | Lee et al. | |
| 8,472,307 | B1 | 6/2013 | Harris et al. | |
| 8,917,198 | B2 | 12/2014 | Pagnanelli | |
| 8,958,510 | B1 * | 2/2015 | Harris | H03H 17/0294 375/350 |
| 9,014,649 | B2 | 4/2015 | Anandakumar et al. | |
| 9,755,869 | B2 | 9/2017 | Anthony et al. | |
| 10,340,958 | B2 | 7/2019 | Zur et al. | |
| 10,601,510 | B2 | 3/2020 | Wang et al. | |
| 11,063,616 | B2 | 7/2021 | Scott et al. | |
| 11,139,890 | B2 | 10/2021 | Wang et al. | |
| 2002/0098795 | A1 * | 7/2002 | Brede | H04B 10/272 375/E7.002 |
| 2004/0252772 | A1 | 12/2004 | Renfors et al. | |
| 2013/0016798 | A1 * | 1/2013 | Velazquez | H04L 25/14 341/155 |
| 2016/0224093 | A1 * | 8/2016 | Shibayama | G06F 17/142 |
| 2019/0104002 | A1 * | 4/2019 | Thompson | H03H 17/0273 |
| 2020/0036398 | A1 * | 1/2020 | Scott | H04B 1/0021 |
| 2023/0336161 | A1 * | 10/2023 | Song | H04L 5/06 |

FOREIGN PATENT DOCUMENTS

| | | | |
|---|---|---|---|
| WO | 2006046188 | A1 | 5/2006 |
| WO | 2007117459 | A2 | 10/2007 |
| WO | 2020023216 | A1 | 1/2020 |

* cited by examiner

Channelizer Input Data Stream
300A

Two Phase Reorder Circuit 220

128 Point Sample Reorder
1000

In frame select
940

| | | | | | | | | | | | | | | | |
|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 |
| 1 | 0 | 3 | 2 | 5 | 4 | 7 | 6 | 9 | 8 | 11 | 10 | 13 | 12 | 15 | 14 |
| 0 | 1 | 2 | 3 | 4 | 5 | 6 | 7 | 8 | 9 | 10 | 11 | 12 | 13 | 14 | 15 |
| 1 | 0 | 3 | 2 | 5 | 4 | 7 | 6 | 9 | 8 | 11 | 10 | 13 | 12 | 15 | 14 |
| 0 | 1 | 2 | 3 | 4 | 5 | 6 | 7 | 8 | 9 | 10 | 11 | 12 | 13 | 14 | 15 |
| 1 | 0 | 3 | 2 | 5 | 4 | 7 | 6 | 9 | 8 | 11 | 10 | 13 | 12 | 15 | 14 |
| 0 | 1 | 2 | 3 | 4 | 5 | 6 | 7 | 8 | 9 | 10 | 11 | 12 | 13 | 14 | 15 |
| 1 | 0 | 3 | 2 | 5 | 4 | 7 | 6 | 9 | 8 | 11 | 10 | 13 | 12 | 15 | 14 |

Out DPR select
970

| | | | | | | | | | | | | | | | |
|---|---|---|---|---|---|---|---|---|---|---|---|---|---|---|---|
| 0 | 2 | 4 | 6 | 8 | 10 | 12 | 14 | 1 | 3 | 5 | 7 | 9 | 11 | 13 | 15 |
| 0 | 2 | 4 | 6 | 8 | 10 | 12 | 14 | 1 | 3 | 5 | 7 | 9 | 11 | 13 | 15 |
| 0 | 2 | 4 | 6 | 8 | 10 | 12 | 14 | 1 | 3 | 5 | 7 | 9 | 11 | 13 | 15 |
| 0 | 2 | 4 | 6 | 8 | 10 | 12 | 14 | 1 | 3 | 5 | 7 | 9 | 11 | 13 | 15 |
| 1 | 3 | 5 | 7 | 9 | 11 | 13 | 15 | 0 | 2 | 4 | 6 | 8 | 10 | 12 | 14 |
| 1 | 3 | 5 | 7 | 9 | 11 | 13 | 15 | 0 | 2 | 4 | 6 | 8 | 10 | 12 | 14 |
| 1 | 3 | 5 | 7 | 9 | 11 | 13 | 15 | 0 | 2 | 4 | 6 | 8 | 10 | 12 | 14 |
| 1 | 3 | 5 | 7 | 9 | 11 | 13 | 15 | 0 | 2 | 4 | 6 | 8 | 10 | 12 | 14 |

Input address
950

| | | | | | | | | | | | | | | | |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 1 | 1 | 1 | 1 | 1 | 1 | 1 | 1 |
| 2 | 2 | 2 | 2 | 2 | 2 | 2 | 2 | 2 | 2 | 2 | 2 | 2 | 2 | 2 | 2 |
| 3 | 3 | 3 | 3 | 3 | 3 | 3 | 3 | 3 | 3 | 3 | 3 | 3 | 3 | 3 | 3 |
| 4 | 4 | 4 | 4 | 4 | 4 | 4 | 4 | 4 | 4 | 4 | 4 | 4 | 4 | 4 | 4 |
| 5 | 5 | 5 | 5 | 5 | 5 | 5 | 5 | 5 | 5 | 5 | 5 | 5 | 5 | 5 | 5 |
| 6 | 6 | 6 | 6 | 6 | 6 | 6 | 6 | 6 | 6 | 6 | 6 | 6 | 6 | 6 | 6 |
| 7 | 7 | 7 | 7 | 7 | 7 | 7 | 7 | 7 | 7 | 7 | 7 | 7 | 7 | 7 | 7 |

Output address
960

| | | | | | | | | | | | | | | | |
|---|---|---|---|---|---|---|---|---|---|---|---|---|---|---|---|
| 0 | 0 | 0 | 0 | 0 | 0 | 0 | 0 | 1 | 1 | 1 | 1 | 1 | 1 | 1 | 1 |
| 2 | 2 | 2 | 2 | 2 | 2 | 2 | 2 | 3 | 3 | 3 | 3 | 3 | 3 | 3 | 3 |
| 4 | 4 | 4 | 4 | 4 | 4 | 4 | 4 | 5 | 5 | 5 | 5 | 5 | 5 | 5 | 5 |
| 6 | 6 | 6 | 5 | 6 | 6 | 6 | 6 | 7 | 7 | 7 | 7 | 7 | 7 | 7 | 7 |
| 0 | 0 | 0 | 0 | 0 | 0 | 0 | 0 | 1 | 1 | 1 | 1 | 1 | 1 | 1 | 1 |
| 2 | 2 | 2 | 2 | 2 | 2 | 2 | 2 | 3 | 3 | 3 | 3 | 3 | 3 | 3 | 3 |
| 4 | 4 | 4 | 4 | 4 | 4 | 4 | 4 | 5 | 5 | 5 | 5 | 5 | 5 | 5 | 5 |
| 5 | 5 | 6 | 6 | 6 | 6 | 5 | 6 | 7 | 7 | 7 | 7 | 7 | 7 | 7 | 7 |

FIG. 10A

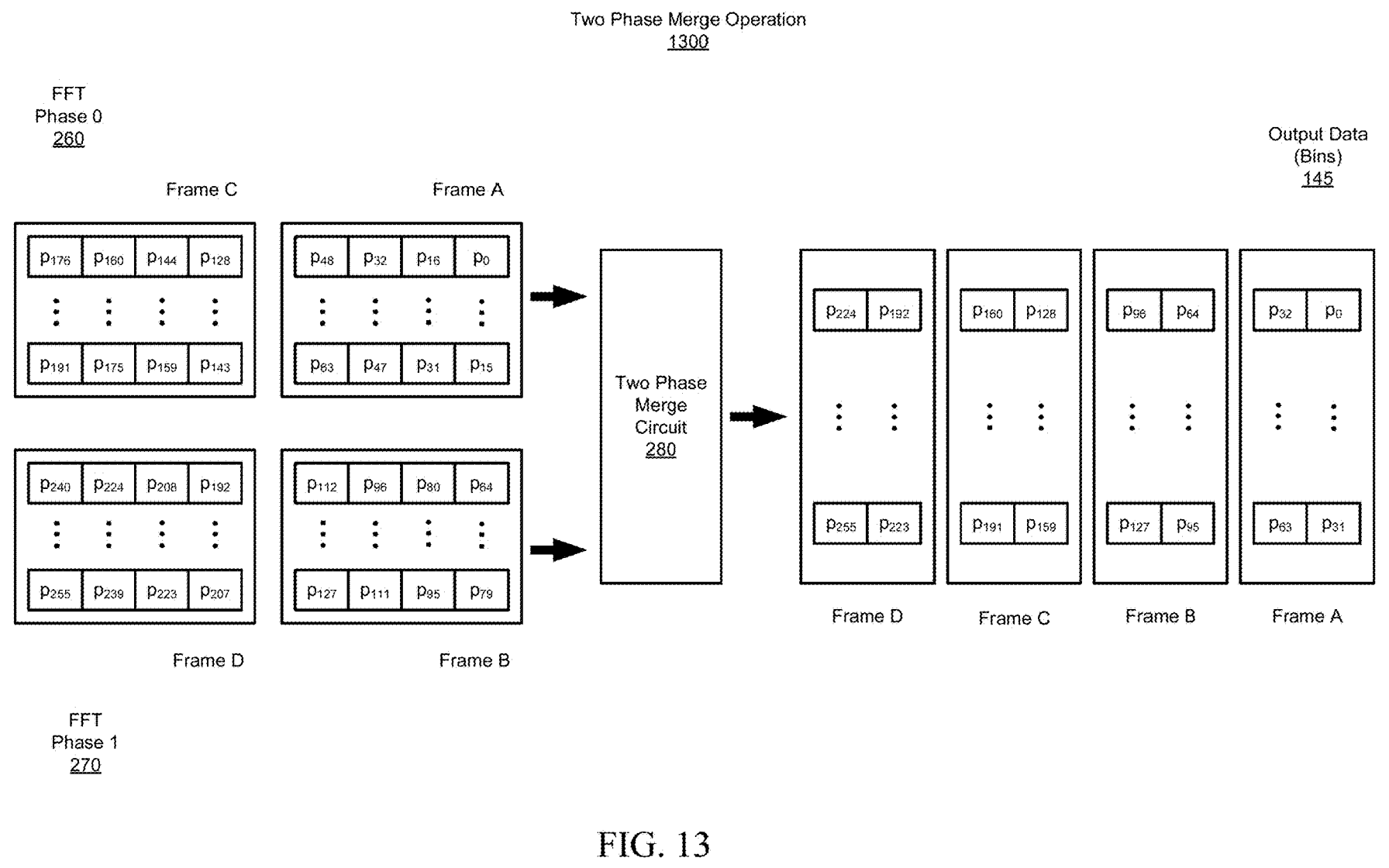

Two Phase Merge Operation
1300

FFT
Phase 0
260

Frame C $p_{176}$ $p_{160}$ $p_{144}$ $p_{128}$ $p_{191}$ $p_{175}$ $p_{159}$ $p_{143}$ Frame A $p_{48}$ $p_{32}$ $p_{16}$ $p_0$ $p_{63}$ $p_{47}$ $p_{31}$ $p_{15}$ FFT
Phase 1
270

Frame D $p_{240}$ $p_{224}$ $p_{208}$ $p_{192}$ $p_{255}$ $p_{239}$ $p_{223}$ $p_{207}$ Frame B $p_{112}$ $p_{96}$ $p_{80}$ $p_{64}$ $p_{127}$ $p_{111}$ $p_{95}$ $p_{79}$ Two Phase
Merge
Circuit
280

Frame D $p_{224}$ $p_{192}$ $p_{255}$ $p_{223}$

Frame C $p_{160}$ $p_{128}$ $p_{191}$ $p_{159}$

Frame B $p_{96}$ $p_{64}$ $p_{127}$ $p_{95}$

Frame A $p_{32}$ $p_0$ $p_{63}$ $p_{31}$

Output Data
(Bins)
145

FIG. 13

DYNAMICALLY RECONFIGURABLE OVERSAMPLED CHANNELIZER

FIELD OF DISCLOSURE

The present disclosure relates to channelizers, and more particularly to dynamically reconfigurable, two times (2×) oversampled channelizers.

BACKGROUND

Many signal processing applications, including communications, radar systems, and electronic warfare applications, require that an input signal be channelized or separated into frequency bins for subsequent analysis and/or manipulation. As the frequency range for signals of interest increases, the computational complexity requirements for channelization also increase. As such, existing channelizers may become unsuitable for some applications where size, weight, and power are constrained.

BRIEF DESCRIPTION OF THE DRAWINGS

FIG. 10A illustrates a 128 point sample reorder, in accordance with certain embodiments of the present disclosure.

FIG. 13 illustrates operation of the two phase merge circuit of the reconfigurable channelizer of FIG. 2, in accordance with certain embodiments of the present disclosure.

Figure 1:
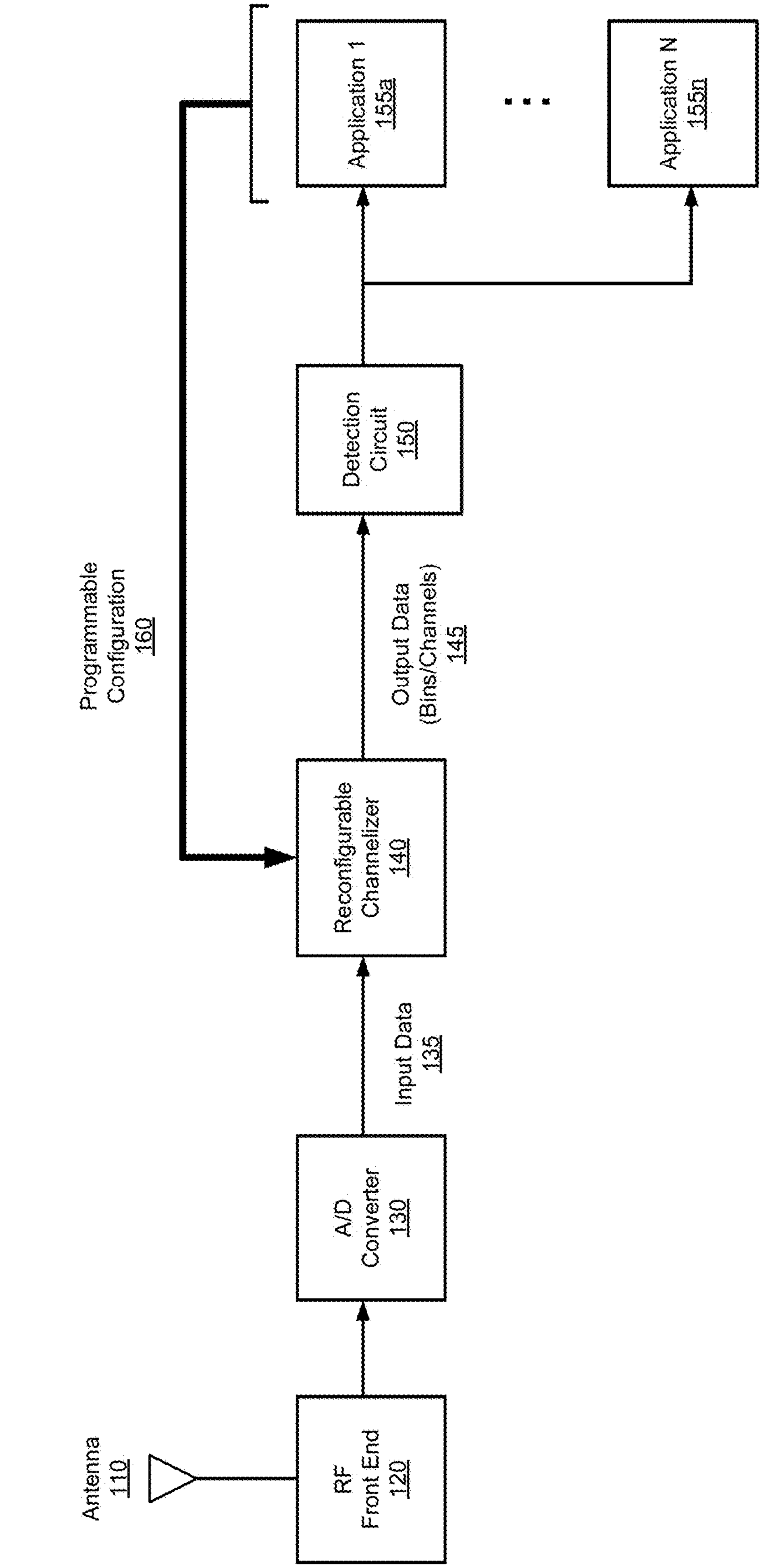
FIG. 1 is a block diagram of a receiver employing a reconfigurable channelizer, in accordance with certain embodiments of the present disclosure.

Although the following Detailed Description will proceed with reference being made to illustrative embodiments, many alternatives, modifications, and variations thereof will be apparent in light of this disclosure.

DETAILED DESCRIPTION

Techniques are provided herein for dynamically reconfigurable two times (2×) oversampled channelizers with increased efficiency. As noted previously, many signal processing applications, including communications, radar systems, and electronic warfare applications, require that an input signal be channelized or separated into frequency bins for subsequent analysis and/or manipulation. Different signals may require different degrees of channelization (e.g., number of frequency bins or frequency resolution). A dynamically reconfigurable channelizer architecture allows for in-field modification of the number of frequency bins and their frequency response. The dynamically reconfigurable channelizer is suitable for field programmable gate arrays (FPGAs) and complex programmable logic devices (CPLDs) as well as application specific integrated circuits (ASICs) where the architecture cannot be modified once deployed. Additionally, in some applications the signal environment can be rapidly changing, creating a need for dynamic reconfiguration of the channelization parameters (e.g., frequency bin shape and size). Dynamically reconfigurable channelizers accommodate various channelization requirements without requiring multiple instantiations of customized channelizers. Dynamically reconfigurable channelizers are therefore particularly suitable in applications that require such flexibility, while being constrained in size and power consumption, such as airborne or spaceborne platforms, or smartphones and tablets. Unfortunately, existing channelizer architectures are associated with a number of layout-based and performance-based inefficiencies, such as use of duplicative circuitry rather than shared resources, over-reliance on relatively large registers, and underutilized mathematical operators (e.g., complex multiplies) and memories, to name a few examples.

To this end, and in accordance with an embodiment of the present disclosure, a dynamically reconfigurable 2× oversampled channelizer is disclosed which provides improved efficiency through the use of pipelined stages and other techniques, as described below. Additionally, the techniques lend themselves particularly well to implementation in an application specific integrated circuit (ASIC).

The disclosed channelizer can be used, for instance, with receivers in a wide variety of applications including, for example, radar systems and communication systems that can be deployed on aircraft (manned and unmanned), guided munitions and projectiles, space-based systems, electronic warfare systems, and other communication systems including cellular telephones, and smartphones, although other applications will be apparent. In a more general sense, the disclosed techniques are useful for any systems in which RF signals of interest are received, digitized, and channelized, in an environment or application where channelization parameters need to be dynamically reconfigured (e.g., updated in real time while the system is operating). In accordance with an embodiment, the reconfigurable channelizer includes a polyphase filter, a two phase reorder circuit, an FFT (or IFFT) circuit, and a two phase merge circuit. The polyphase filter is configured to filter time domain input data to control spectral shaping of frequency bins of the channelizer output. The two phase reorder circuit is configured to split the filtered data into first and second phases to be provided to two pipelined channels of the FFT circuit. The FFT circuit is configured to transform the first and second phase channels to first and second phase frequency domain data. The two phase merge circuit is configured to merge the first and second phase frequency domain data for distribution into the output frequency bins of the 2× oversampled channelizer. Reconfigurable parameters for the channelizer include the filter coefficients, the number of filter folds or taps, and the number of frequency bins, according to an example.

It will be appreciated that the techniques described herein may provide improved channelization capabilities, compared to channelizers that operate with fixed or otherwise pre-determined (non-configurable) parameters, or other types of circuits that are not as efficient as ASICs. For instance, while the channelizer techniques provided herein may be implemented in an FPGA according to some example embodiments, an ASIC implementation is not constrained by the existing routing architecture of an FPGA. Numerous embodiments and applications will be apparent in light of this disclosure.

System Architecture

FIG. 1 is a block diagram of a receiver 100 employing a reconfigurable channelizer 140, in accordance with certain embodiments of the present disclosure. The receiver is shown to include an antenna 110, an RF front end 120, an analog to digital converter (ADC) 130, and the reconfigurable channelizer 140, which provides channelized data bins 145. In some embodiments, the channelized data may be provided to a detection circuit 150 that is configured to compare energy in each of the bins to a threshold value to detect a signal of interest. In some embodiments, the channelized data and/or the output of the detection circuit may be provided to signal processing applications 155.

The antenna 110 is configured to receive one or more RF signals. The RF front end 120 is configured to pre-process or condition the received RF signal. In some embodiments, the preprocessing may include one or more of automatic gain control, low noise amplification, additional amplification, pre-filtering to relatively wide frequency bands of interest, or any other suitable operations, depending on the needs of the downstream applications 155. The ADC 130 is configured to convert the analog pre-processed RF signal to a digital signal as input data 135 to the reconfigurable channelizer 140.

The reconfigurable channelizer 140 is configured to convert the input data 135 into frequency domain output data 145 that is channelized or separated into a selected number of frequency bins. The number of channels or frequency bins, as well as the coefficients for the filters that generate those channels, are dynamically programmable, which is to say that they can be modified as the system is running. For example, any number of downstream applications 155*a*-155*n* that consume the output data 145, can configure the channelizer 140 to meet the needs of that application. For example, frequency bands of interest may vary over time and the channelizer can be reprogrammed in a relatively rapid manner to adapt to those changes. Applications may include, for example, communications systems, radar systems, or any system in which RF signals are received or processed. In some embodiments, the channelizer 140 may be configured or implemented within an ASIC. In some embodiments, the ADC 130 and the channelizer 140 may be implemented within a combination of ASICs.

Figure 2:
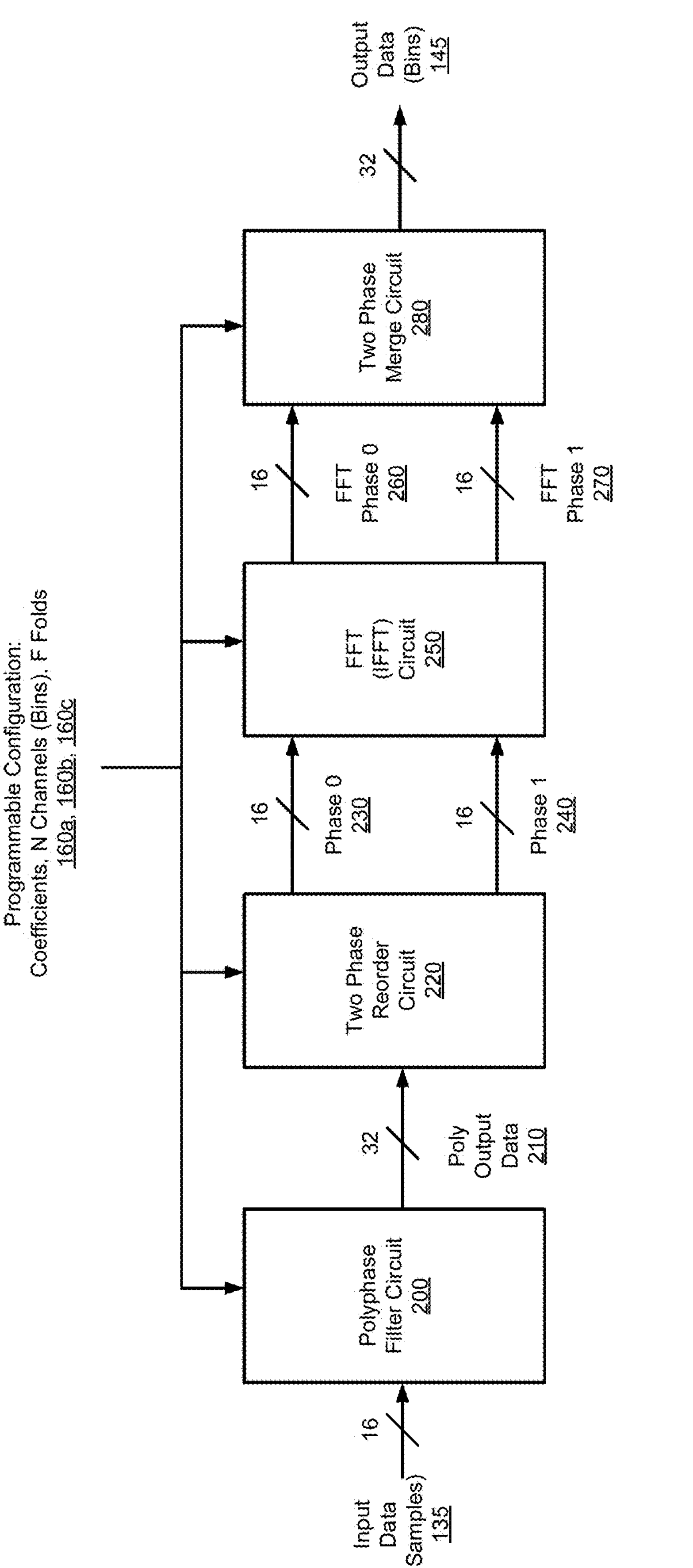
FIG. 2 is a block diagram of the reconfigurable channelizer of FIG. 1, configured in accordance with certain embodiments of the present disclosure.

FIG. 2 is a block diagram of the reconfigurable channelizer 140 of FIG. 1, configured in accordance with certain embodiments of the present disclosure. The reconfigurable 2× oversampled channelizer 140 includes a polyphase filter circuit 200, a two phase reorder circuit 220, an FFT (or IFFT) circuit 250, and a two phase merge circuit 280, so as to provide a two times (2×) oversampled channelizer. The polyphase filter circuit 200 is configured to filter the input data 135 to generate polyphase output data 210 to control the shape of the bins of the output data 145 (e.g., the sharpness of the edges of the frequency bands of the bins). The two phase reorder circuit 220 is configured to convert the format of the polyphase output data 210 into a phase 0 signal 230 and a phase 1 signal 240, which is a format compatible with the FFT circuit 250. In particular, the 2× oversampled data is converted into two out of phase, critically sampled data streams for processing by the FFT circuit. The FFT circuit 250 is configured to convert the time domain data (phase 0 230 and phase 1 240) into frequency domain data (FFT phase 0 260 and FFT phase 1 270) in a relatively efficient manner. In some embodiments, the FFT circuit may be employed to implement an IFFT with in-phase/quadrature (I/Q) swapping and normalization, as will be described below. The two phase merge circuit 280 is configured to merge the FFT phase 0 260 and FFT phase 1 270 data into output data bins/channels 145. In particular, the two out of phase, critically sampled channelizer responses are merged into one 2× oversampled channelized response. The operation of these circuits is based at least in part on reconfigurable parameters that include polyphase filter coefficients 160*a*, the number of channels or bins (N) 160*b*, and the number of polyphase filter folds or taps (F) 160*c*, as will be explained in greater detail below.

Figure 3A:
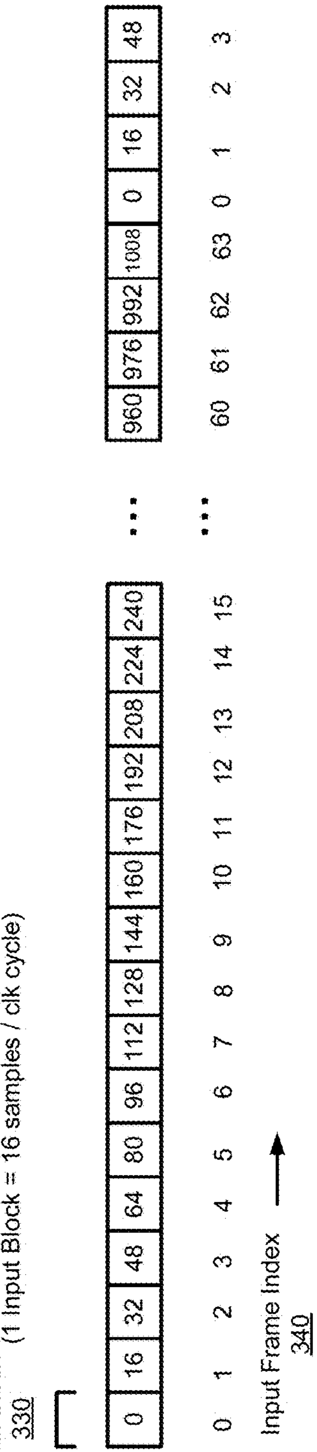
FIG. 3A illustrates the input data stream for the reconfigurable channelizer of FIG. 2, in accordance with certain embodiments of the present disclosure.

FIG. 3A illustrates the input data stream 300A for the reconfigurable channelizer 140 of FIG. 2, in accordance with certain embodiments of the present disclosure. In one embodiment described herein, an input block 330 is defined as 16 consecutive input samples which are provided to the channelizer on every clock cycle. In some embodiments, each input data sample comprises 16 bits of complex data (16 I-bits and 16 Q-bits, or 32 bits total), which is provided on an input data lane, or simply "lane." The embodiment described herein comprises 16 input lanes and each lane comprises 32 signal lines which feed the 32 data inputs to the reconfigurable channelizer. Thus, there are a total of 512 data inputs to the reconfigurable channelizer to handle the 16 samples of 32 bits every clock cycle. In other embodiments, the number of samples, bits, and lanes may be changed to any desired values. An input frame index 340 counts input blocks 330 and serves as a means of synchronizing control logic internal to the reconfigurable channelizer, as will be described. In one embodiment described herein, the input frame index may be sourced from a 6 bit counter which starts at zero and wraps around back to zero after reaching 63. A 6 bit input frame counter is sufficient to synchronize channelizations up to 1024 output bins when an input block comprises 16 samples. In other embodiments, the number of samples per clock cycle, the sample sizes (e.g., in bits), and the number of channelizations may vary (e.g., greater than 1024).

Figure 3B:
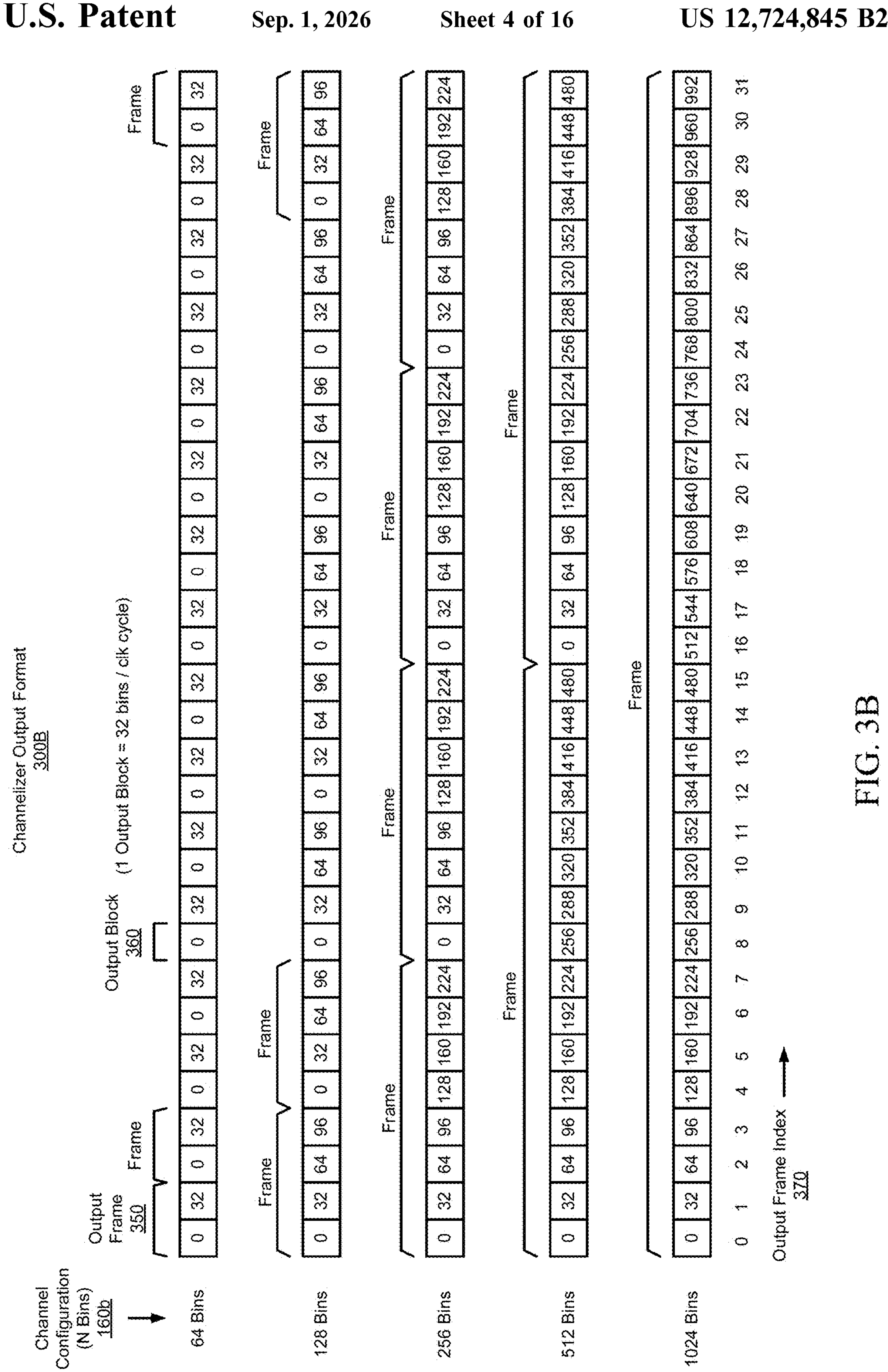
FIG. 3B illustrates the output data format for the reconfigurable channelizer of FIG. 2, in accordance with certain embodiments of the present disclosure.

FIG. 3B illustrates the output data format 300B for the reconfigurable channelizer 140 of FIG. 2, in accordance with certain embodiments of the present disclosure. The output data format depends on the number of bins N 160*b* of the channel configuration, as well as the number of samples per clock cycle. In general, x input samples per clock cycle results in 2× output bins per clock cycle. Here, five examples are shown: 64 bins, 128 bins, 256 bins, 512 bins, and 1024 bins. In all the illustrated cases, an output block 360 is defined as 32 sequential frequency bins which are generated by the channelizer on every clock cycle. In some embodiments, each bin comprises a 16 bit complex data sample associated with a frequency point (16 I-bits and 16 Q-bits, or 32 bits total) which is provided on an output lane. In one embodiment described herein, each lane comprises 32 signal lines which are fed to 32 data outputs of the reconfigurable channelizer. In one embodiment described herein, there are a total of 1024 data outputs of the reconfigurable channelizer to handle the 32 samples of 32 bits every clock cycle. In the 64 bin case, an output frame 350 comprises 2 output blocks. In the 128 bin case, an output frame comprises 4 output blocks. In the 256 bin case, an output frame comprises 8 output blocks. In the 512 bin case, an output frame comprises 16 output blocks. In the 1024 bin case, an output frame comprises 32 output blocks. Different configurations are possible in other embodiments, however, once the output sample size is specified and the number of samples per output block is specified, the output dimensions and data rate become fixed regardless of the channelization configuration (number of bins). An output frame index 370 counts output blocks and serves as an index into the frame. In some embodiments, the output frame index is implemented as a 5 bit counter which starts at zero and wraps around back to zero after reaching 31. The output frame index uniquely identifies every output block in an output frame for the 1024 bin case. In some other embodiments, some of the most significant bits (MSBs) of the 5 bit counter are zeroed out depending on the number of bins (e.g., 64 bin case—4 MSBs are zeroed, 128 bin case—3 MSBs are zeroed, . . . 1024 bin case—no MSBs are zeroed).

The reconfigurable channelizer operates at 2× oversampling to allow for full frequency band coverage (although band coverage can be limited as desired by choice of programmable filter coefficients). In a 2× oversampled channelizer, the input data is sampled at a rate of $F_s$ samples per second and the output data rate (per bin) is $2F_s/N$, where N is the number of bins. Furthermore, in a 2× oversampled channelizer, the bin spacing is $F_s/N$, which allows for alias free bin overlap. In some embodiments, the input sampling rate $F_s$ is 8000 MHz where 16 samples per clock cycle are provided per 500 MHz clock cycle.

Figure 4:
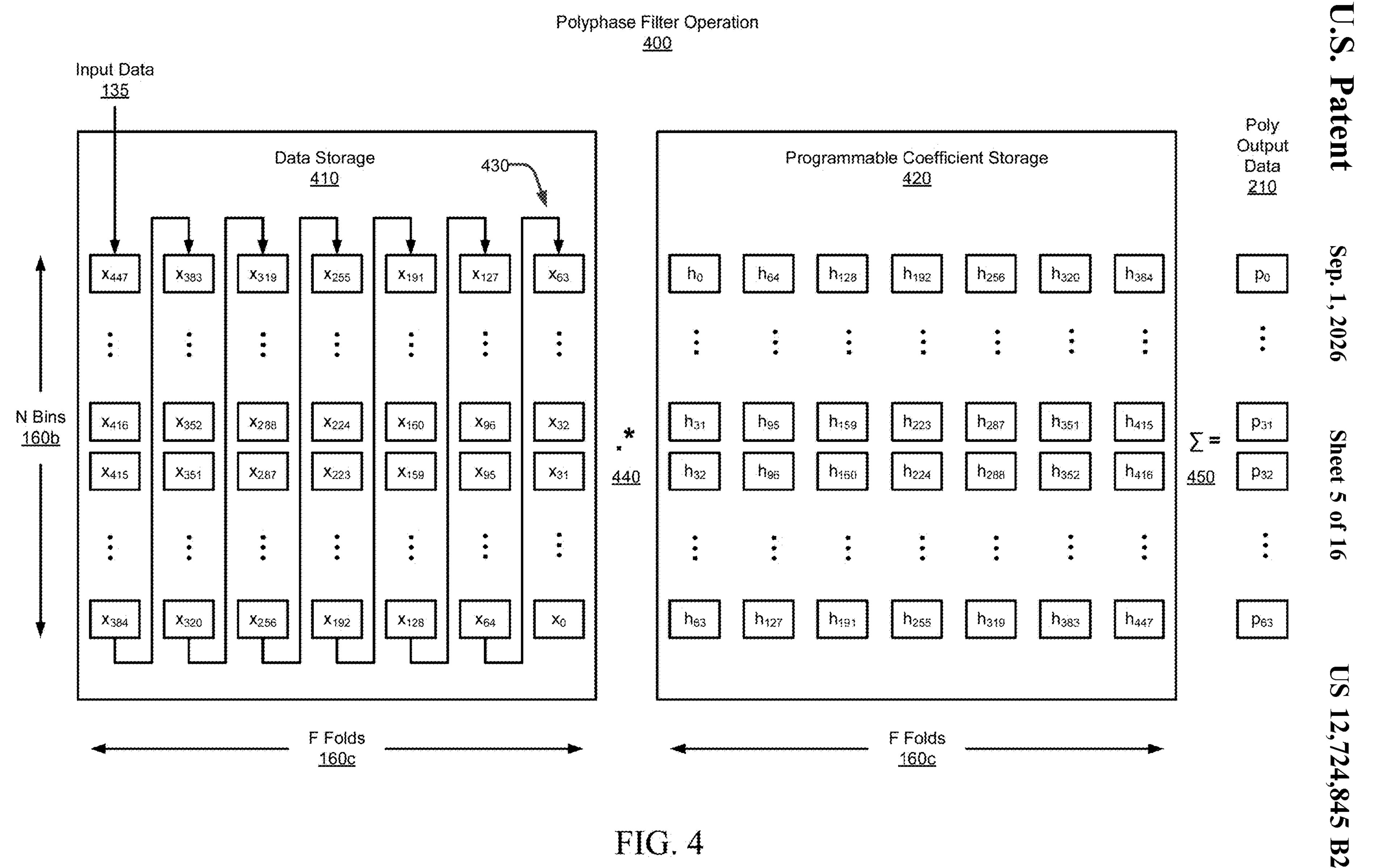
FIG. 4 illustrates operation of the polyphase filter circuit of the reconfigurable channelizer of FIG. 2, in accordance with certain embodiments of the present disclosure.

FIG. 4 illustrates operation 400 of the polyphase filter circuit 200 of the reconfigurable channelizer 140 of FIG. 2, in accordance with certain embodiments of the present disclosure. In this example, the operation is illustrated for the case of 64 bins (N=64), which is the number of programmable channelizer bins 160*b* (as well as the number of polyphase partition stages). Also, in this example, there are 7 folds (F=7), which is the number of programmable folds 160*c* or taps per polyphase partition stage, allowing for a finite impulse response (FIR) filter with up to 448 taps. Increasing the number of folds, F, would allow for higher order FIR filters.

The programmable polyphase filter coefficients ($h_k$) 160*a* are loaded into programmable coefficient storage 420. The coefficients are selected, for example using a filter design tool, to provide the desired or required shape for the channelizer bins, which may depend on the application. In some embodiments, the coefficients are 18 bits.

Input data ($x_i$) 135, enters the channelizer in blocks of 16 samples per clock cycle. The input data is buffered (as described below in connection with FIG. 5) and propagates through the filter data storage 410 in blocks of 32 samples as shown by the arrowed paths 430. Thus, 32 samples of input data are written into the polyphase filter on every other clock cycle. In general, the polyphase filter 200 generates a new N-sample output $p_j$ 210 for every new N/2 input samples, by performing a pointwise multiply 440 between the stored input data and the stored programmable coefficients, followed by a summation 450 across the rows. For example, polyphase output $p_0=x_{447}*h_0+x_{383}*h_{64}+ \ldots x_{63}*h_{384}$. Data is streamed out of the polyphase filter as 32 samples of filtered data on each clock cycle. In this example, where N=64, a frame of 64 filter output samples is generated on every 2 clock cycles. Although the 64 bin case is illustrated here, and in the architecture shown in FIG. 5, that architecture can be configured for other channelizations (e.g., different numbers of bins).

Figure 5:
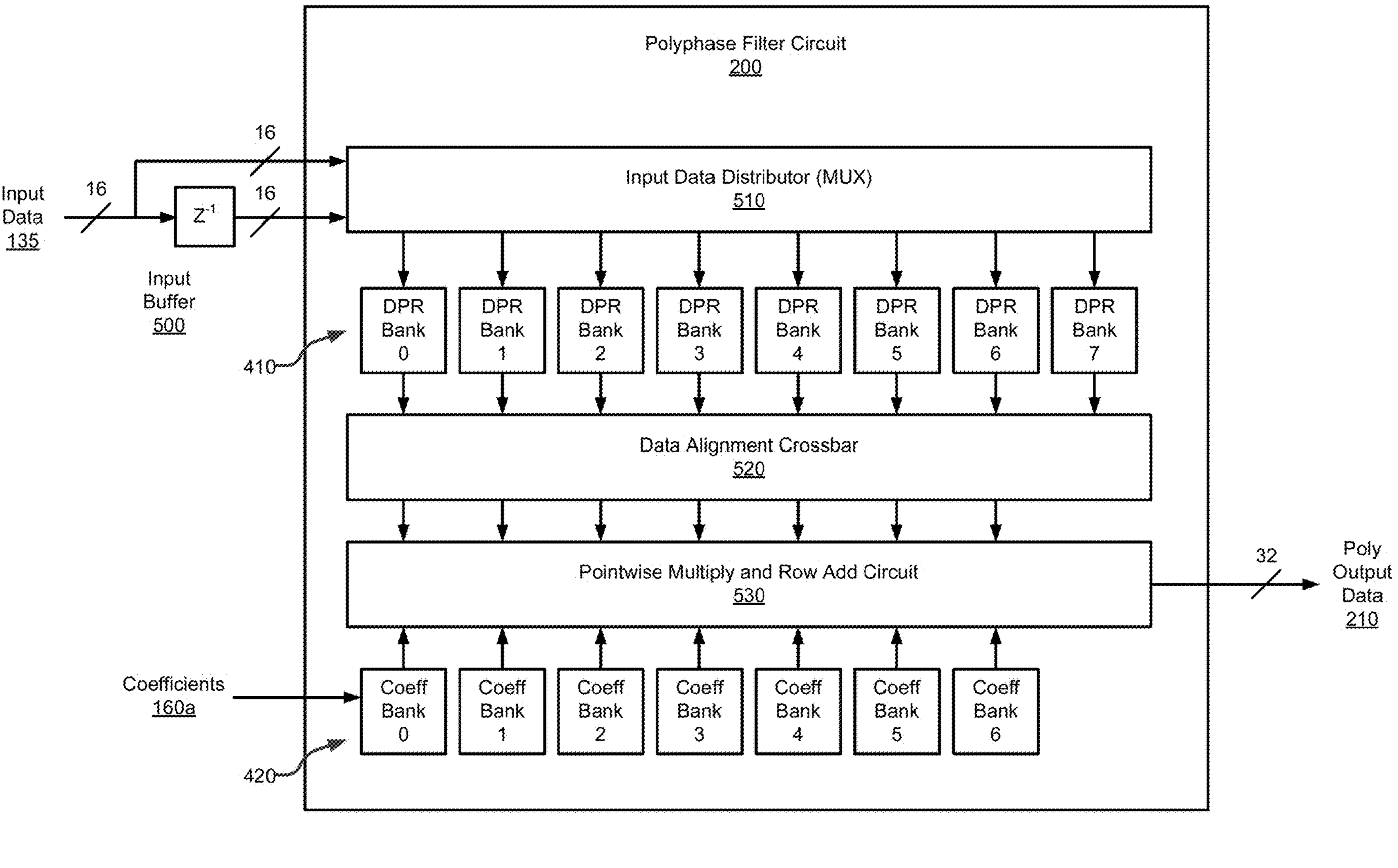
FIG. 5 is a block diagram of the polyphase filter circuit of FIG. 4, configured in accordance with certain embodiments of the present disclosure.

FIG. 5 is a block diagram of the polyphase filter circuit 200 of FIG. 4, configured in accordance with certain embodiments of the present disclosure. The polyphase filter circuit is shown to include an input buffer 500, an input data distributor (e.g., a crossbar switch, or equivalently, a bank of multiplexers or MUXs) 510, data storage 410, data alignment crossbar 520, pointwise multiply and row add circuit 530, and coefficient storage 420. Another embodiment of the polyphase filter may use registers to store data and coefficient values. However, rather than overly relying on registers, the depicted example uses dual port random access memory and crossbar circuitry, to achieve a number of efficiency gains. For instance, DPRs can be more area efficient than registers. In addition, crossbar circuitry can be implemented, for instance, in FPGA and ASIC technology, and is particularly well-suited to efficient implementation in ASIC technology.

In this embodiment, the input buffer 500 is configured to buffer 16 samples of input data 135 provided on a first clock cycle and forward that data, along with a subsequent 16 samples of input data 135 provided on a second clock cycle, to the input data distributor 510. In this embodiment, each data sample is 16 bits of complex data (16 bits for I and 16 bits for Q) or 32 bits total, and is provided on a lane, as previously described. As such, the input data distributer 510 is fed with 32 samples of input data 135, on 32 32-bit lanes, on every other clock cycle. The input data distributor 510 is configured to distribute the input data to the data storage 410.

In this embodiment, data storage 410 is configured as 8 (F+1) banks of dual port ram (DPR) to store input data 135. The additional DPR bank (i.e., the bank in excess of F) is used to avoid read/write contention issues. Coefficient storage 420 is configured as 7 (F) banks of DPR to store the programmable coefficients. Each of the DPR banks are sized to support a 1024 channel polyphase filter bank (e.g., the largest example described herein). So, for a 64 channel configuration, each DPR bank comprises 32 2-deep DPRs. For a 128 channel configuration, each DPR bank comprises 32 4-deep DPRs, and so on up to a 1024 channel configuration which comprises 32 32-deep DPRs.

The input data distributor MUX 510 writes input data to one data storage DPR bank at a time (e.g., 32 data sample are written into 32 DPRs at a time). So, for an N bin channelizer, DPR bank 0 is loaded with N data samples, then DPR bank 1 is loaded with the next N data samples, and so on. After DPR bank F is loaded, the system cycles back to DPR bank 0.

Additionally, the polyphase filter circuit is configured to reverse the order of the filter output relative to the filter input. As can be seen, in FIG. 4, the orientation of output samples $p_0$-$p_{63}$ is in reverse order, for example, relative to input samples $x_{63}$-$x_0$.

The F DPR banks are read on every clock cycle and their contents are fed through the data alignment crossbar 520 to the pointwise multiply and row add circuit 530. The reading and writing of DPR banks are organized such that simultaneous reading and writing of the same DPR location does not occur when that location is an output of the data alignment crossbar 520, thus avoiding read-write contention issues. The crossbar circuit 520 is a switch matrix that can selectively couple any of a number of input ports to any of a number of output ports.

Data alignment crossbar 520 comprises a bank of 32 8×7 crossbars that are configured to align the input data samples with the coefficients. The alignment is performed because the DPR bank number associated with the newest data samples changes as the process proceeds. In some embodiments, the data alignment crossbar 520 may be configured to align the coefficients to the data, rather than the data to the coefficients, as this may reduce the area of the crossbar component on the ASIC, since the data width may be greater than the coefficient width.

Pointwise multiply and row add circuit 530 is configured to perform the pointwise multiply between the input data and the stored programmable coefficients, followed by a summation across rows, as previously described. In this embodiment, on each clock cycle, F*32 real-times-complex multiples are performed along with 32 complex F-input additions. The pointwise multiply and row add circuit 530 is shown as a single circuit but can readily be implemented as two distinct circuits (e.g., multiply circuit 530*a* and adder circuit 530*b*). More generally, circuit 530 can be thought of as including a multiply circuit and an adder circuit. In some embodiments, the coefficients are scaled such that the maximum output of any polyphase partition stage is close to, and strictly less than 1 (in the sum of absolute value sentence). Typically, this means that the coefficients for an N bin channelizer are scaled up by N/2 so that the DC gain is N/2.

In some embodiments, data storage 410 comprises 32 times (F+1) or 256 32-wide×32-deep DPRs, and coefficient storage 420 comprises 32 times F or 224 18-wide×32-deep DPRs. In some embodiments, the pointwise multiply and row add circuit 530 comprises 448 real multipliers (64 real multipliers per fold) and 384 real adders (64 7-input adder trees, one adder input per fold).

Figure 6:
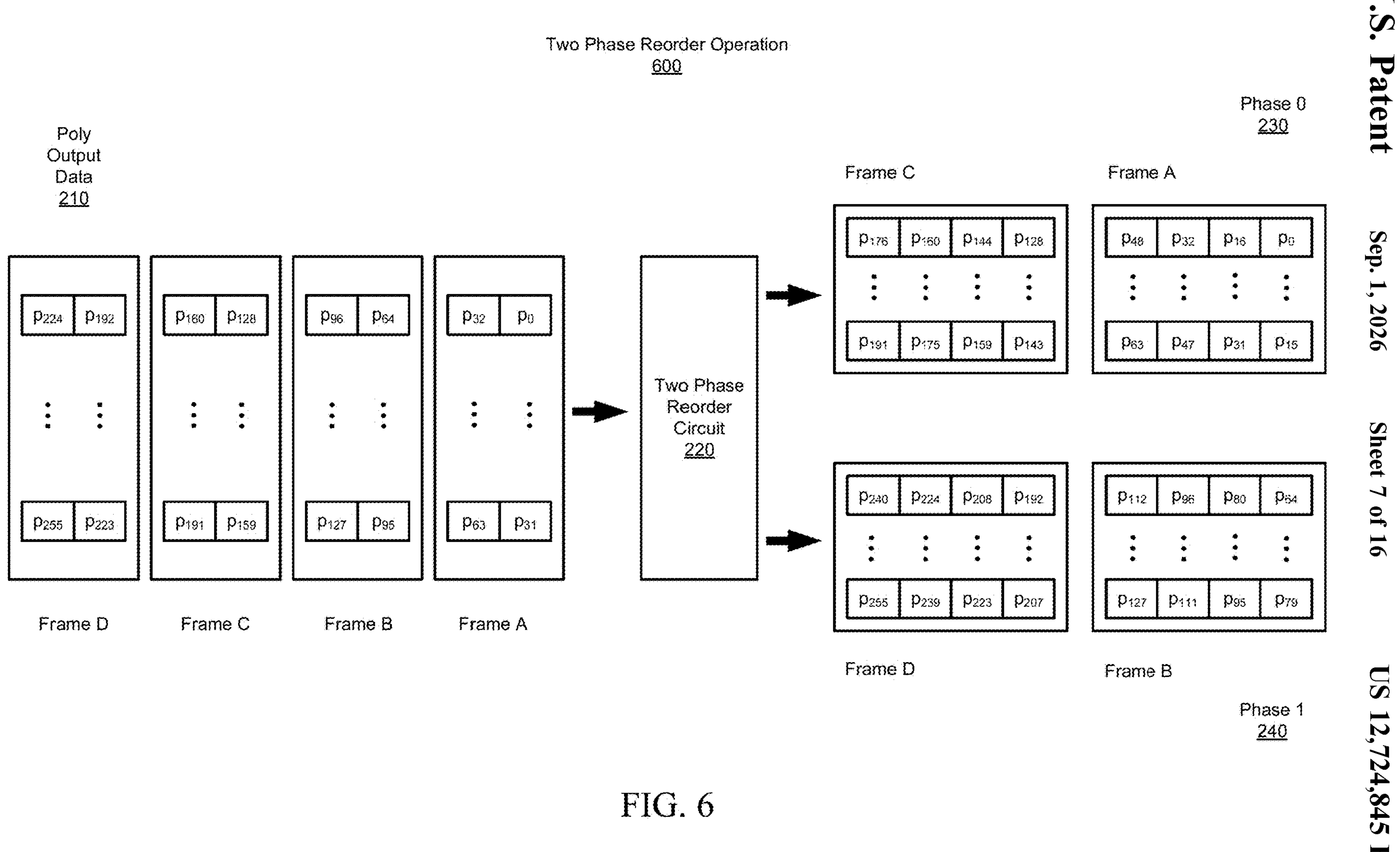
FIG. 6 illustrates operation of the two phase reorder circuit of the reconfigurable channelizer of FIG. 2, in accordance with certain embodiments of the present disclosure.

FIG. 6 illustrates operation 600 of the two phase reorder circuit 220 of the reconfigurable channelizer 140 of FIG. 2, in accordance with certain embodiments of the present disclosure when configured for 64 bin channelization. The two phase reorder circuit 220 is configured to interface between the polyphase filter circuit 200 and the 2× Oversampled channelizer optimized FFT circuit 250.

As previously described, the polyphase filter circuit 200 generates frames of N sample data in a single output stream 210, at 32 samples per clock cycle (on 32 lanes, one sample per lane). The two phase reorder circuit 220 is configured to separate the 32 sample wide data stream 210 into two 16 sample wide streams (phase 0 230 and phase 1 240) to be provided to each of two inputs of the FFT. As will be described below, the FFT circuit 250 is implemented as a dual channel FFT capable of processing two streams of data at a time. In the case of a 2× oversampled channelizer, the second stream originates from input data that was delayed from that of the first stream (e.g., delayed by N/2 samples). The frames alternate such that every other frame is processed by the same FFT channel. For example, frames A, C, . . . are processed by the first FFT channel and frames B, D, . . . are processed by the second FFT channel.

Figure 7:
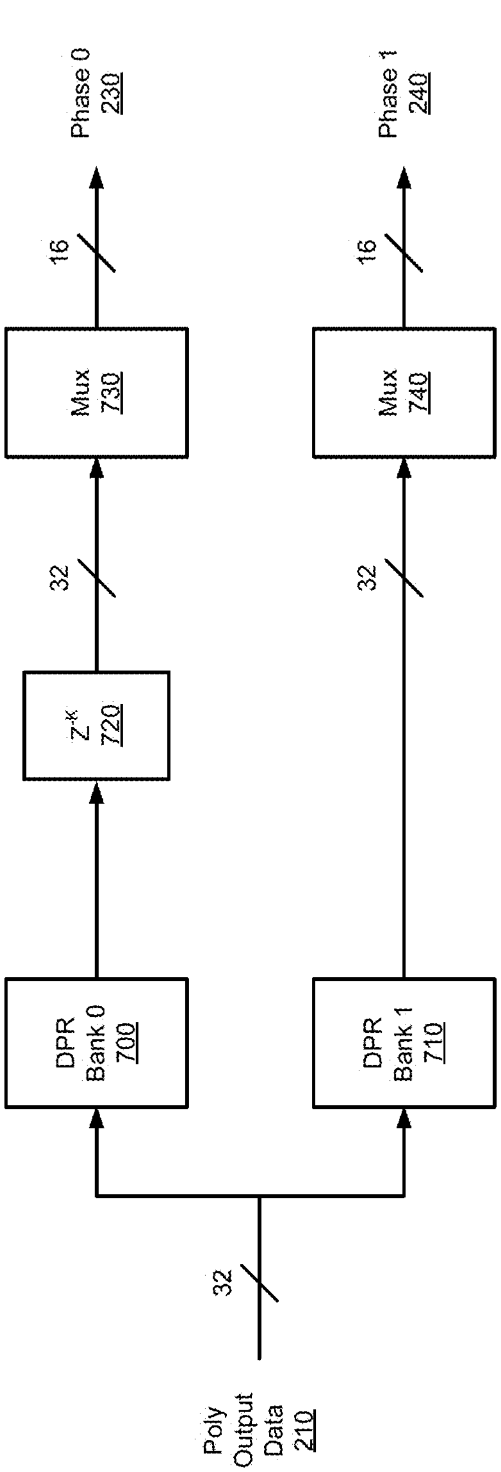
FIG. 7 is a block diagram of the two phase reorder circuit of FIG. 6, configured in accordance with certain embodiments of the present disclosure.

FIG. 7 is a block diagram of the two phase reorder circuit 220 of FIG. 6, configured in accordance with certain embodiments of the present disclosure. The two phase reorder circuit 220 is shown to include DPR bank 0 700, DPR bank 1 710, delay element 720, MUX 730, and MUX 740.

On every clock cycle, 32 samples of data 210 are provided to the reorder circuit and two streams of 16 sample output data (phase 0 230 and phase 1 240) are generated by the reorder circuit. DPR bank 0 700 and DPR bank 1 710 are configured to buffer the input samples to the reorder circuit (the polyphase output data 210). Delay element $z^{-k}$ 720 is configured to delay the top stream by k clock cycles, where k=N/32. In some embodiments, delay element 720 may be implemented as an additional DPR. MUX 730 is configured to select every other frame (e.g., A, C, . . . ) for output as phase 0 230 and MUX 740 is configured to select every other alternate frame (e.g., B, D, . . . ) for output as phase 1 240.

Figure 8:
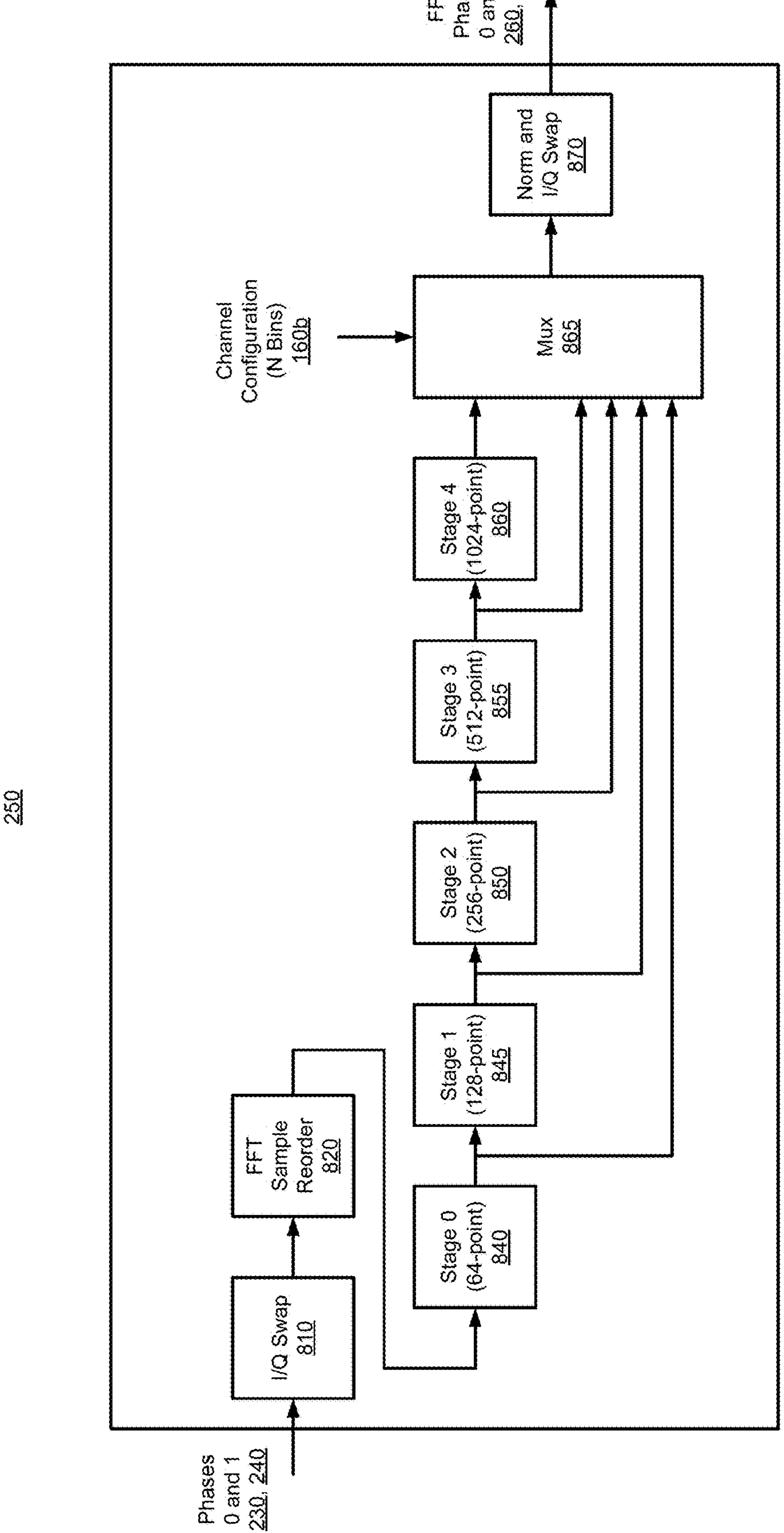
FIG. 8 is a block diagram of the fast Fourier transform (FFT) circuit of the reconfigurable channelizer of FIG. 2, employed to implement an inverse FFT (IFFT), configured in accordance with certain embodiments of the present disclosure.

FIG. 8 is a block diagram of the FFT circuit 250 of the reconfigurable channelizer 140 of FIG. 2, configured in accordance with certain embodiments of the present disclosure. The two channel FFT circuit 250 is implemented as one coupled FFT circuit. Each of the FFTs of the coupled FFT circuit are identically configured and process a data stream independently of the other FFT. In the case of this dynamically reconfigurable channelizer, however, each FFT is fed by data provided by the Polyphase Filter Circuit 200, via the Two Phase Reorder Circuit 220. In so doing, the 2× oversampled data stream from the Polyphase Filter Circuit is processed as two out of phase critically sampled data streams by the FFT circuit 250. Note that the term “channels” as applied to the two channel FFT architecture should not be confused with the use of the term “channel” as applied to the output bins of the reconfigurable channelizer, where channels are synonymous with bins (e.g., 64, 128, . . . 1024 output bins or channels). In the case of the FFT, the two channels are associated with the two data streams.

In this embodiment, the FFT functionality is employed to implement an IFFT by swapping the input I and Q components, swapping the output I and Q components, and scaling or normalizing the output by a factor of N.

This two channel architecture merges the two FFT circuits to provide a pipelined, streaming implementation that improves efficiency by sharing of resources needed to process two FFT channels. For example, with regard to the butterfly stages (described below), instead of employing X complex multipliers running at a 50% duty cycle, only X/2 complex multipliers are employed, running at a 100% duty cycle. Additionally, read only memories (ROMs) that store the twiddle factors (also referred to as coefficients) may be shared between the two circuits. In some embodiments, miscellaneous control logic may also be shared.

The two channel, streaming, FFT circuit 250, used to implement an IFFT, is shown in FIG. 8 to include an I/Q swap circuit 810, an FFT sample reorder circuit 820, stage 0 through stage 4 circuits (840, 845, 850, 855, 860) which support 64-point through 1024-point FFTs, a MUX 865, and a final normalization and I/Q swap circuit 870. For each input channel 230, 240, data propagates through the FFT stages in 16 lanes. After an initial pipeline delay, each channel generates an N-point FFT every N/16 clock cycles.

For each input channel, the I/Q swap circuit 810 is configured to swap the 16 bit I and 16 bit Q components of the data samples.

For each input channel, the FFT sample reorder circuit 820 is configured to reorder the data samples, depending on the bin configuration N, so that the subsequent FFT stage associated with that bin configuration generates the correct FFT. The FFT sample reorder circuit 820 will be described in greater detail below in connection with FIG. 9.

For each input channel, stage 0 through stage 4 circuits (840, 845, 850, 855, 860) are configured to perform a cascaded series of computations (e.g., in a pipelined fashion) from which an FFT of desired size (e.g., 64-point through 1024-point) can be obtained by tapping into the output of the appropriate stage. Each stage uses a butterfly circuit 1100, as will be described in greater detail below in connection with FIG. 11. MUX 865 is configured to select the output from the appropriate stage based on the channel configuration parameter (N bins) 160*b*.

For each input channel, normalization and I/Q swap circuit 870 is configured to scale the output by a factor of 1/N and re-swap the 16 bit I and 16 bit Q components so that the result is an IFFT.

Figure 9:
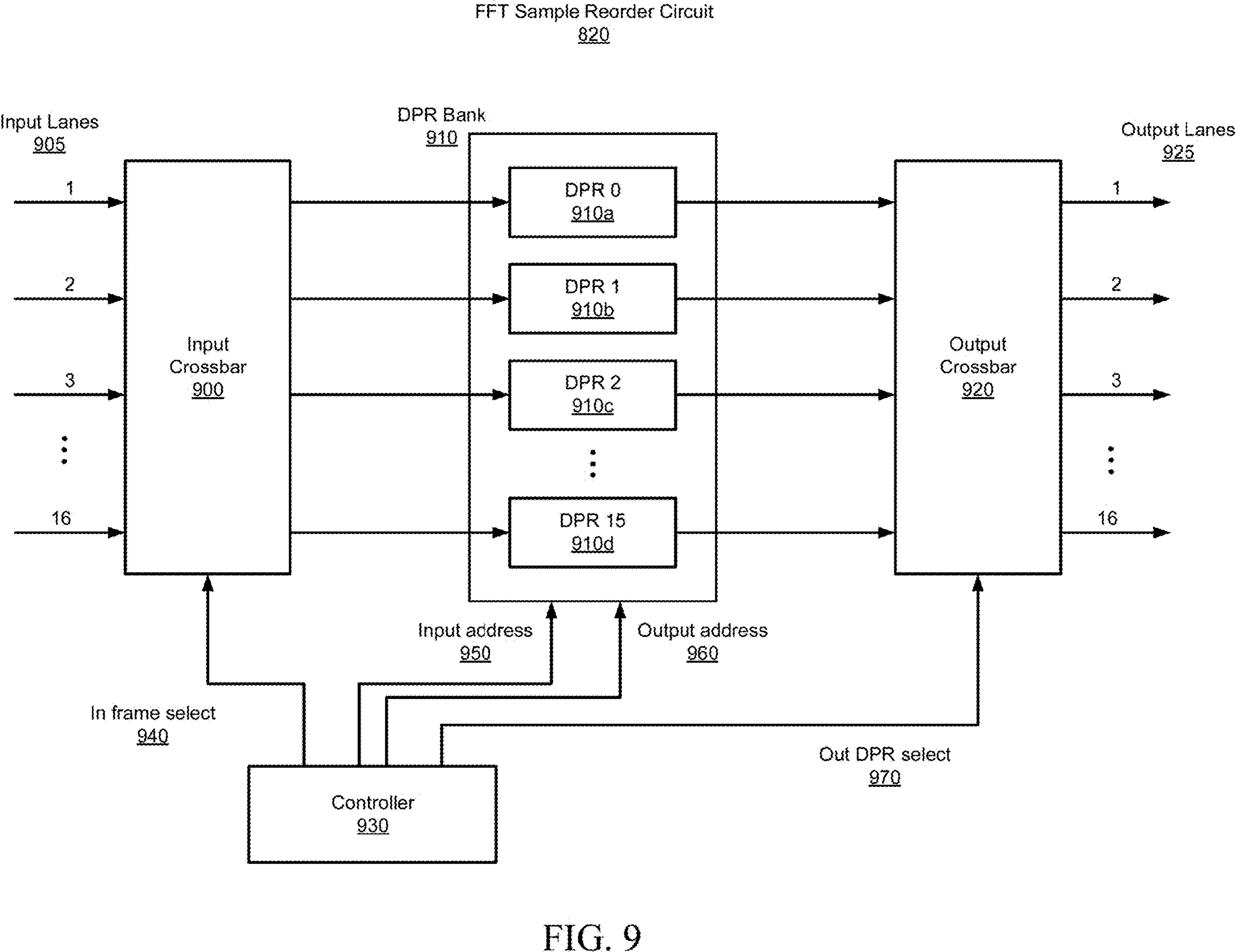
FIG. 9 is a block diagram of the FFT sample reorder circuit of the IFFT circuit of FIG. 8, configured in accordance with certain embodiments of the present disclosure.

FIG. 9 is a block diagram of the FFT sample reorder circuit 820 of the FFT circuit of FIG. 8, configured in accordance with certain embodiments of the present disclosure. Because the two channels are processed identically in the reorder circuit 820 the data paths are widened to accommodate data from each channel. As such each input lane, 905, shown in 820 contains I/Q samples (swapped) from both channels 230 and 240. The FFT sample reorder circuit 820 is configured to reorder the samples provided to the downstream pipelined FFT stages such that the output of the desired stage is valid (e.g., correctly processed). In other words, the reordering depends on the selected FFT size and thus the outputs of any stage other than the stage associated with the desired FFT size (and the appropriate sample reordering) will generate invalid outputs. In some embodiments, the memories of the unused stages may be disabled and the data in the unused stages held constant to conserve power.

The FFT sample reorder circuit 820 is shown to include an input crossbar 900, DPR bank 910 comprising DPRs 0-15 910*a*-910*d*, an output crossbar 920, and a controller 930.

The controller 930 is configured to generate an input frame selection value (e.g., a routing command) 940 to control the input crossbar 900 to determine the routing of input lanes 905 to DPRs 910. The controller 930 is also configured to generate an input address (e.g., a write address) 950 to select an address (e.g., a location) in the DPR bank to receive the input sample (e.g., through a DPR write port). The controller 930 is also configured to generate an output address (e.g., a read address) 960 to select an address (e.g., a location) in the DPR bank, from which the sample is to be read (e.g., through a DPR read port). The controller 930 is also configured to generate an output DPR selection value (e.g., a routing command) 970 to control the output crossbar 920 to determine the routing of DPRs to output lanes 925.

Figure 10B:
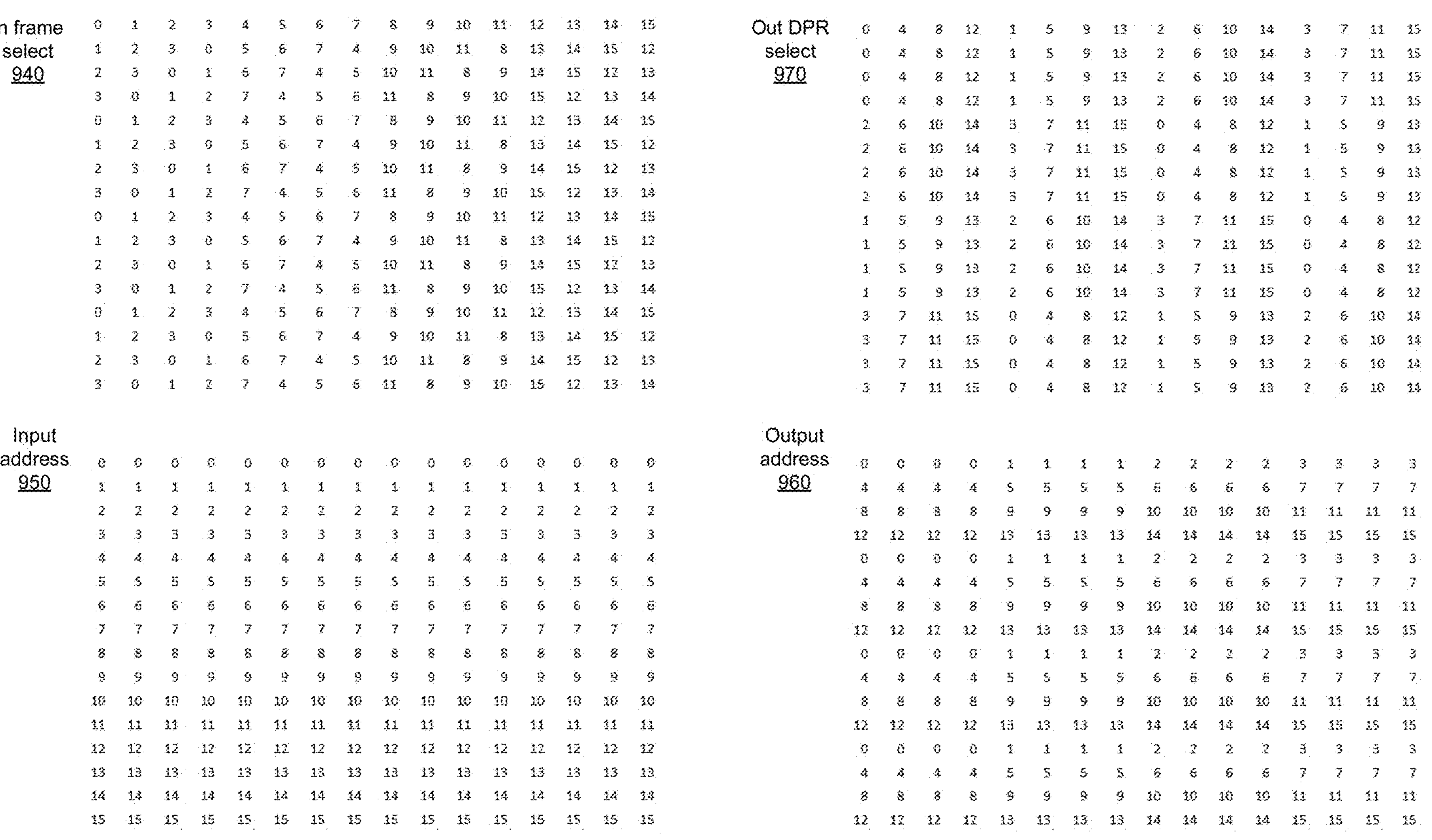
FIG. 10B illustrates a 256 point sample reorder, in accordance with certain embodiments of the present disclosure.

For a 64 point FFT, no reordering is required. An example of a sample reorder process 1000 for a 128 point FFT is illustrated in FIG. 10A, in accordance with certain embodiments of the present disclosure. The reorder process is defined by the 128 values of the input frame select 940, the corresponding values of the input address 950, the corresponding values of the output DPR select 970, and the corresponding values of the output address 960. Similarly, an example of a sample reorder process 1010 for a 256 point FFT is illustrated in FIG. 10B, in accordance with certain embodiments of the present disclosure.

In some embodiments, the parameters which specify the sample reordering (input frame select 940, input address 950, output address 960, and output DPR select 970) are pre-determined and may be stored in a look up table LUT (e.g., a ROM). The parameters may be selected to manipulate the data flow through the DPRs to avoid the need to read a DPR more than once in the same clock cycle so that only one DPR read port and one DPR write port are required. The architecture shown in FIG. 9 can be configured for multiple channelizations.

Figure 11:
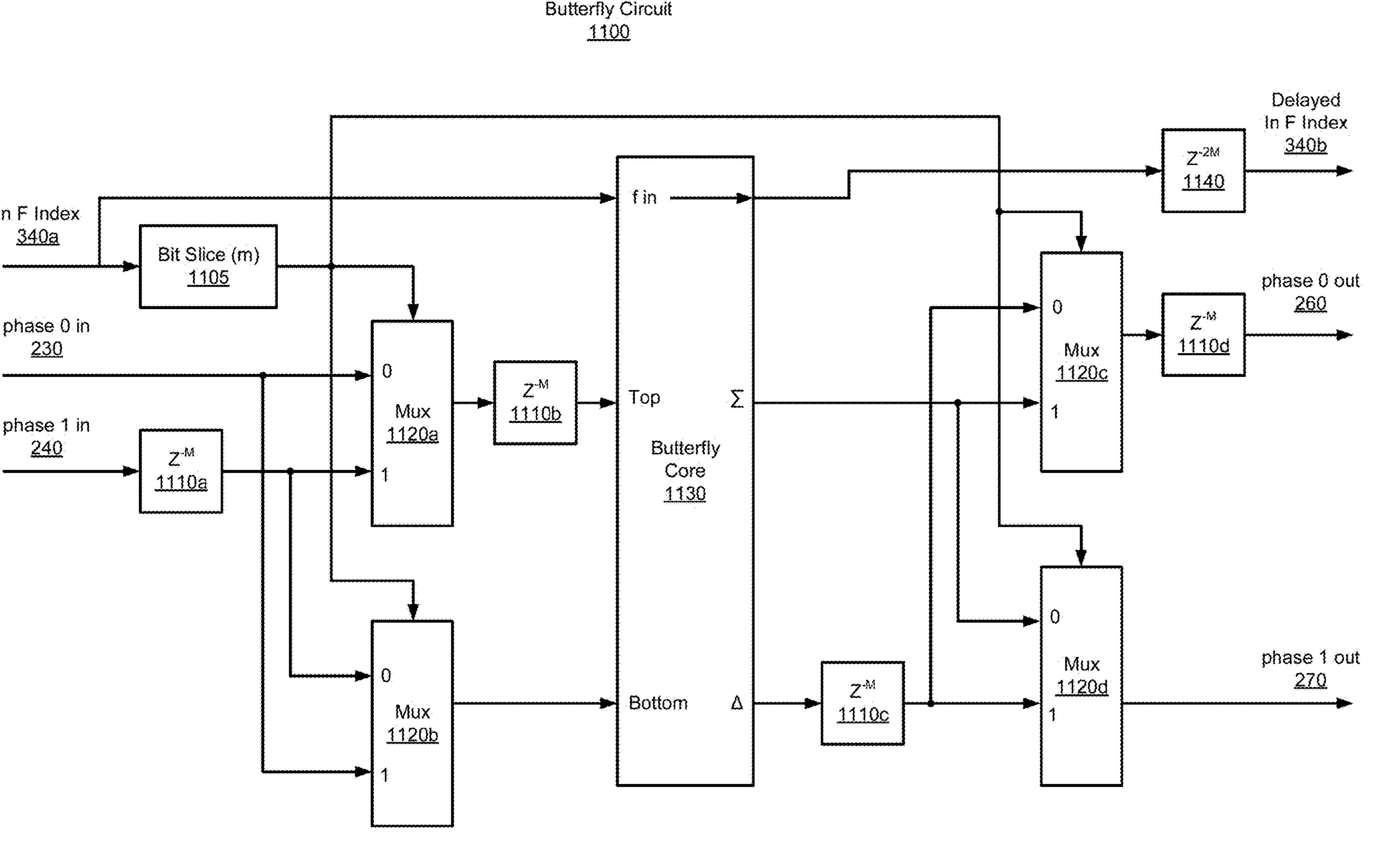
FIG. 11 is a block diagram of a multiplexed butterfly circuit of the stages of the FFT circuit of FIG. 8, configured in accordance with certain embodiments of the present disclosure.

FIG. 11 is a block diagram of a multiplexed butterfly circuit 1100 used in stages 0-4 of the FFT circuit of FIG. 8, configured in accordance with certain embodiments of the present disclosure. The butterfly circuit 1100 is configured so that the two channels (phase 0 input 230 and phase 1 input 240) are time multiplexed within the same butterfly circuit without requiring an increase in clock rate. This configuration exploits the fact that twiddle factors and associated complex multiplies are only needed for the second half of each data frame. As a result, each channel consumes twiddle related resources only fifty percent of the time.

The multiplexed butterfly circuit 1100 is used in the implementation of the 64-point FFT of the stage 0 circuit 840. According to an embodiment, the 64-point FFT is constructed using two 16-point FFTs, and two multiplexed butterfly circuits 1100: one configured for a 32-point FFT output, and one configured for a 64-point FFT output. The stage 1 circuit 845 includes a butterfly circuit 1100 configured for a 128-point FFT output. The stage 2 circuit 850 includes a butterfly circuit 1100 configured for 256-point FFT output. The stage 3 circuit 855 includes a butterfly circuit 1100 configured for a 512-point FFT output. The stage 4 circuit 860 includes a butterfly circuit 1100 configured for a 1024-point FFT output. The butterfly circuits, which are shared between the phase 0 channel 230 and the phase 1 channel 240, also include memory that is shared between the channels (e.g., to store the pre-computed twiddle factors for the FFT butterfly, as explained below). Each butterfly circuit used in stages 0 to 4, accepts an input frame index 340*a*, a phase 0 channel input 230, and a phase 1 channel input 240; and generate outputs that include a delayed version of the input frame index 340*b*, a phase 0 channel output 260, and a phase 1 channel output 270. A selection of the phase 0 and phase 1 channel outputs from among the stages 0 through 4, may be made based on the desired FFT size.

The multiplexed butterfly circuit 1100 is shown to include bit slicing circuit 1105, delay elements 1110 and 1140; MUXs 1120; and butterfly core circuit 1130. The following descriptions of the butterfly circuit 1100 (and the butterfly core 1130 of FIG. 12) will reference parameters listed in the following table:

TABLE 1

Butterfly Parameters

| Output FFT Size (FFT Stage) | M | m | p |
|---|---|---|---|
| 32 | 1 | 0 | N/A (No ROM) |
| 64 | 2 | 1 | 0 |
| 128 | 4 | 2 | 1 |
| 256 | 8 | 3 | 2 |
| 512 | 16 | 4 | 3 |

TABLE 1-continued

| Butterfly Parameters | | | |
|---|---|---|---|
| Output FFT Size (FFT Stage) | M | m | p |
| 1024 | 32 | 5 | 4 |

As shown in the table, M=Output FFT Size/32, m=$\log_2$(M), and p=m−1, except for the case where Output FFT size is 32 for which the 32 point butterfly has fixed coefficients and no LUT is needed.

Bit slicing circuit 1105 is configured to slice or extract bit m from the input frame index 340. Bit m is used to control MUXs 1120, to select from either of the MUX input ports (labeled '0' or '1') based on the value of bit m. For example, m=0 corresponds to input port '0' while m=1 corresponds to input port '1'.

Delay element 1110*a* is configured to delay the phase 1 input by M clock cycles before providing it to port 1 of the MUX 1120*a* and port 0 of MUX 1120*b*.

Delay element 1110*b* is configured to delay the output of MUX 1120*a* by M clock cycles before providing it to the first branch (e.g., top branch) of the butterfly core circuit 1130. The output of MUX 1120*b* is provided to the second branch (e.g., bottom branch) of the butterfly core circuit. The input frame index 340 is also provided to the butterfly circuit.

The butterfly core circuit 1130 is configured to compute the sum and difference values from the top and bottom branches of the butterfly, as will be described in greater detail below in connection with FIG. 12.

Delay element 1110*c* is configured to delay the difference (delta) output of the butterfly circuit by M clock cycles before providing it to port 0 of MUX 1120*c* and port 1 of MUX 1120*d*. The sum output of the butterfly circuit is provided to port 1 of MUX 1120*c* and port 0 of MUX 1120*d*.

Delay element 1140 is configured to delay the input frame index by 2M clock cycles as it is passed on to the next butterfly circuit. Delay element 1110*d* is configured to delay the output of MUX 1120*c* by M clock cycles to generate the phase 0 output 260 for this butterfly circuit stage. The output of MUX 1120*d* is provided as the phase 1 output 270 for this butterfly stage. Delay element 1110*d* provides alignment of the phase 0 output and the phase 1 output. In some embodiments, the delay provided by element 1110*d* of the current stage can be used to generate the delay provided by delay element 1110*a* of the subsequent stage.

Figure 12:
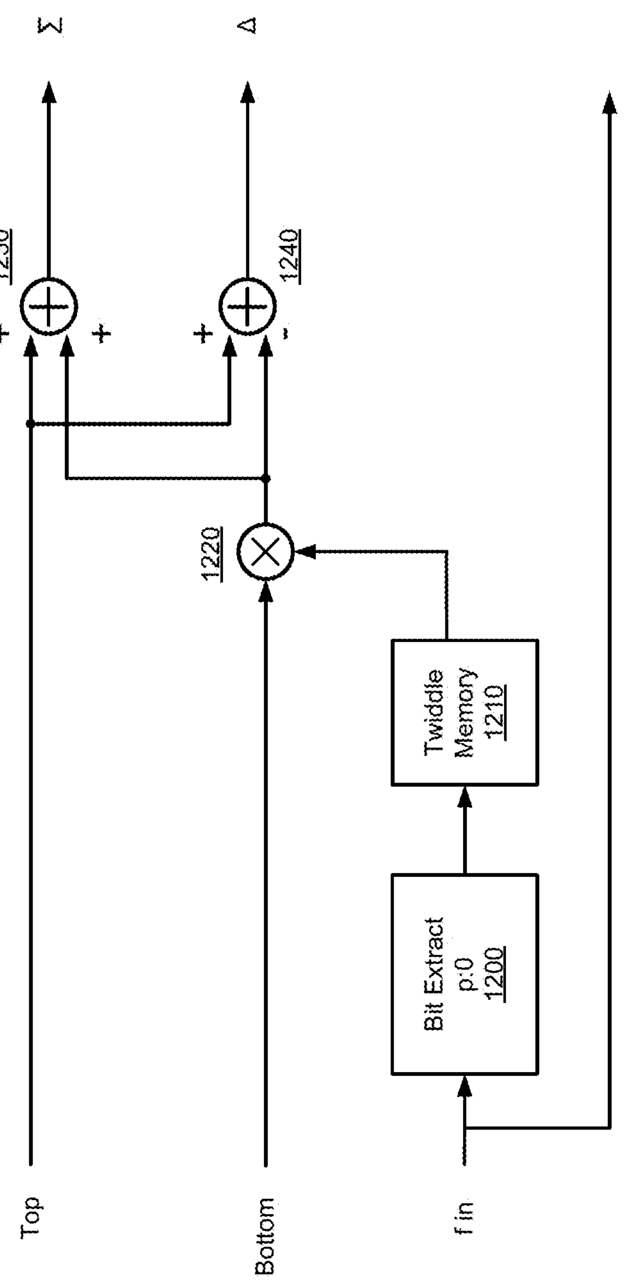
FIG. 12 is a block diagram of the butterfly core of the butterfly circuit of FIG. 11, configured in accordance with certain embodiments of the present disclosure.

FIG. 12 is a block diagram of the butterfly core circuit 1130 of the multiplexed butterfly circuit 1100 of FIG. 11, configured in accordance with certain embodiments of the present disclosure. The butterfly core circuit 1130 is shown to include a bit extraction circuit 1200, a twiddle memory (ROM) 1210, a complex multiplier 1220, and two summers 1230 and 1240.

Bit extraction circuit 1200 is configured to extract bits p down to 0 from the input frame index for use as an index into the twiddle memory 1210.

Twiddle memory 1210 is configured to store the precomputed twiddle factors (e.g., complex roots of unity) for that FFT stage, for example as a lookup table. In some embodiments, the twiddle memory 1210 is configured as a read only memory.

Multiplier 1220 is configured to multiply the input to the bottom branch of the butterfly with the retrieved twiddle factor to generate the scaled bottom branch input.

Summer 1230 is configured to compute the butterfly sum (e.g., the sum of the input to the top branch of the butterfly with the scaled bottom branch input). Summer 1240 is configured to generate the butterfly difference (e.g., the delta between the input to the top branch of the butterfly and the scaled bottom branch input).

FIG. 13 illustrates operation 1300 of the two phase merge circuit 280 of the reconfigurable channelizer 140 of FIG. 2, in accordance with certain embodiments of the present disclosure. The two phase merge circuit 280 is configured to merge frames of FFT phase 0 260 and FFT phase 1 270 in an alternating fashion to generate the channelizer output data 145. For example, frames A, C, . . . of phase 0 are merged with frames B, D, . . . of phase 1 to generate an output stream comprising frames A, B, C, D, . . . etc. More specifically, on every clock cycle, two 16 lane channels from the FFT are merged into one 32 lane output channel comprising data that is 2× oversampled. The two phase merge operation may be considered as the inverse of the previously described two phase reorder operation 600.

Figure 14:
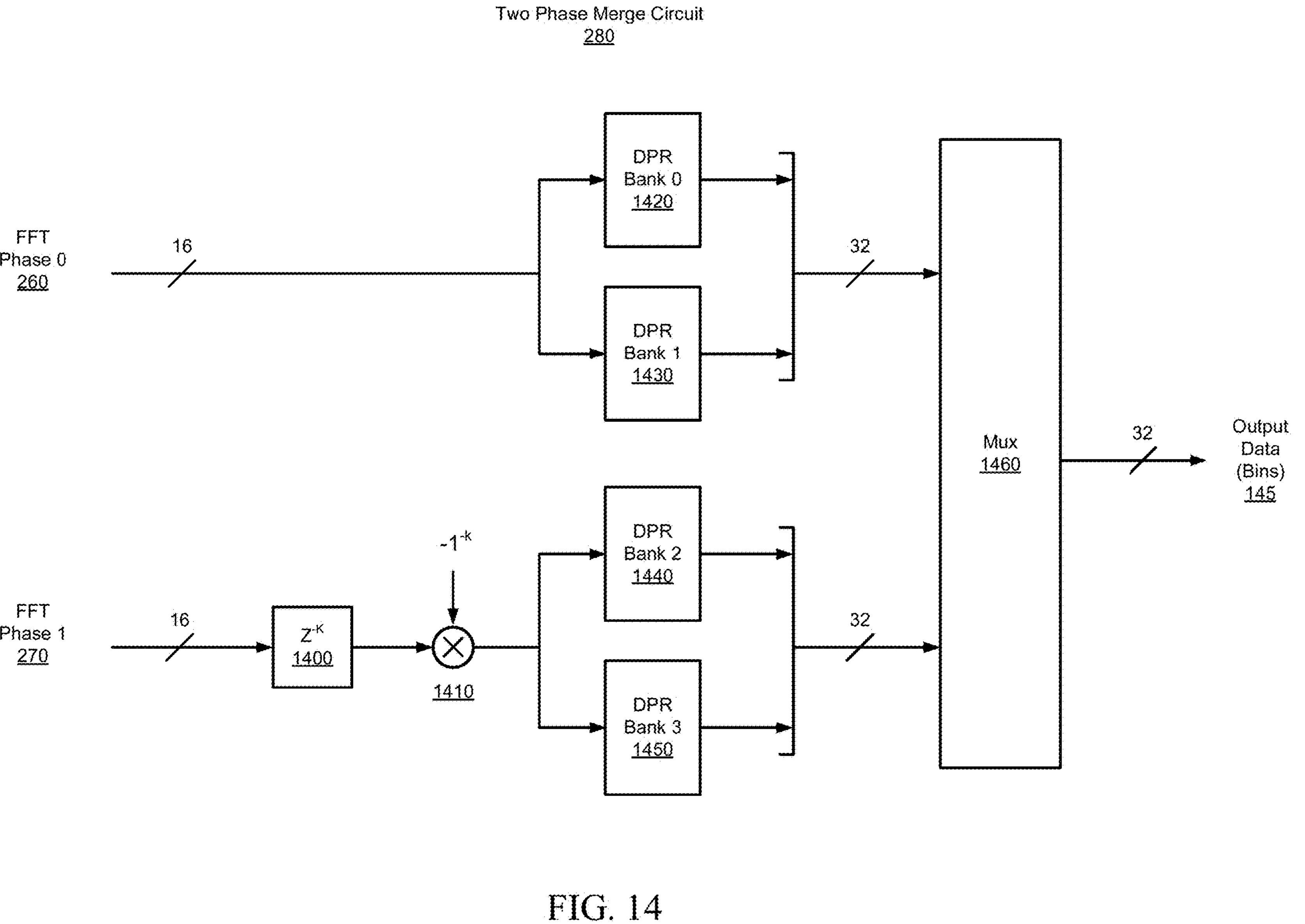
FIG. 14 is a block diagram of the two phase merge circuit FIG. 13, configured in accordance with certain embodiments of the present disclosure.

FIG. 14 is a block diagram of the two phase merge circuit 280 FIG. 13, configured in accordance with certain embodiments of the present disclosure. The two phase merge circuit 280 is shown to include delay element 1400, multiplier 1410, DPR bank 0 1420, DPR bank 1 1430, DPR bank 2 1440, DPR bank 3 1450, and MUX 1460.

Delay element $z^{-k}$ 1400 is configured to delay the second stream 270 by k clock cycles, where k=N/32. This delay is equivalent to N/2 input samples. Multiplier 1410 is configured to correct the time varying bin-dependent phase shift between the FFT output channels which results from delaying channel 1 by N/2 input samples with respect to channel 0. The correction can be achieved by multiplying every other lane in channel 1 by −1 (e.g., $(-1)^{-k}$) before merging the streams, as can be seen from the following equations:

$$x_n \leftrightarrow X_k \rightarrow x_{n-n_0} \leftrightarrow X_k e^{\frac{-j2\pi k n_0}{N}}$$

$$x_n \leftrightarrow X_k \rightarrow x_{n-\frac{N}{2}} \leftrightarrow X_k e^{-j\pi k} = X_k(-1)^{-k}$$

DPR bank 0 1420 and DPR bank 1 1430 are configured to buffer consecutive channels of 16 lanes of samples from the top stream and merge them into a first set of 32 lanes. DPR bank 2 1440 and DPR bank 3 1450 are configured to buffer consecutive channels of 16 lanes of samples from the bottom stream and merge them into a second set of 32 lanes. MUX 1460 is configured to alternately select the first set of 32 lanes (e.g., the outputs of DPR banks 0 and 1) with the second set of 32 lanes (e.g., the outputs of DPR banks 2 and 3) to form channelizer output data 145.

In some embodiments, each of the DPR banks are configured as 16 32-wide×32-deep DPRs.

In some embodiments, the components of the dynamically reconfigurable channelizer may be cascaded and the delays may be consolidated allowing for some of the delay elements to be eliminated thus reducing overall latency.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional structures that include hardware, or a combination of hardware and software, and may comprise, for example, singly or in any combination, hardwired circuitry, programmable circuitry such as computer processors comprising one or more individual instruction processing cores, state machine circuitry, and/or gate level logic. The circuitry may include a processor and/or controller programmed or otherwise configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), communications system, radar system, desktop computers, laptop computers, tablet computers, servers, smartphones, etc. Other embodiments may be implemented as software executed by a programmable device. In any such hardware cases that include executable software, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood, however, that other embodiments may be practiced without these specific details, or otherwise with a different set of details. It will be further appreciated that the specific structural and functional details disclosed herein are representative of example embodiments and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

One example embodiment of the present disclosure provides a reconfigurable channelizer comprising: a polyphase filter circuit configured to filter time domain input data to control spectral shaping of frequency bins of the channelizer output, wherein filter coefficients and a number of folds of the polyphase filter are dynamically programmable; and a fast Fourier transform (FFT) circuit configured to transform the filtered time domain input data to output frequency domain data distributed into the frequency bins, wherein a number of the frequency bins is dynamically programmable.

In some cases, the FFT circuit is employed to implement an inverse fast Fourier transform. In some cases, the FFT circuit comprises: a sample reorder circuit and two or more serially cascaded processing stages, each stage comprising a butterfly circuit configured to compute an N-point FFT butterfly, where N increases by a factor of two for each stage; a first channel circuit configured to transform a first phase of the filtered time domain input data to a first phase of the frequency domain data; and a second channel circuit configured to transform a second phase of the filtered time domain input data to a second phase of the frequency domain data, wherein at each stage, the first channel circuit and the second channel share the butterfly circuit associated with that stage. In some such cases, the FFT circuit comprises five serially cascaded processing stages, the processing stages including a 64-point stage, a 128-point stage, a 256-point stage, a 512-point stage, and a 1024 point stage. In some such cases, the channelizer comprises a two phase reorder circuit configured to split the filtered time domain input data into the first phase of the filtered time domain input data and the second phase of the filtered time domain input data. In some such cases, the channelizer comprises a two phase merge circuit configured to merge the first phase of the frequency domain data with the second phase of the frequency domain data to generate the output frequency domain data. In some cases, the polyphase filter circuit comprises a crossbar circuit configured to align the time domain input data with the filter coefficients and a multiply circuit configured to multiply the aligned time domain input data with the filter coefficients. In some cases, the channelizer is configured to generate the frequency bins for output at a rate equal to two times a frequency spacing between the frequency bins. In some cases, the number of frequency bins is dynamically programmable to one of 64, 128, 256, 512, or 1024, and the number of folds of the polyphase filter is dynamically programmable in the range of one to seven. In some cases, the channelizer output frequency domain data is organized into frames, the frames of length proportional to the number of frequency bins. In some cases, the channelizer is implemented in an application specific integrated circuit.

Another example embodiment of the present disclosure provides a receiver comprising: an analog to digital converter (ADC) configured to convert a received analog signal to a time domain digital signal; and a reconfigurable channelizer configured to convert the time domain digital signal to output frequency domain data distributed into a number of frequency bins of channelizer output, the channelizer including a polyphase filter circuit configured to filter the time domain digital signal to control spectral shaping of the frequency bins of the channelizer output, wherein filter coefficients and a number of folds of the polyphase filter are dynamically programmable, and a fast Fourier transform (FFT) circuit configured to transform the filtered time domain digital signal to the frequency domain data distributed into the frequency bins, wherein the number of the frequency bins is dynamically programmable.

In some cases, the FFT circuit comprises: a sample reorder circuit and two or more serially cascaded processing stages, each stage comprising a butterfly circuit configured to compute an N-point FFT butterfly, where N increases by a factor of two for each stage; a first channel circuit configured to transform a first phase of the filtered time domain digital signal to a first phase of the frequency domain data; and a second channel circuit configured to transform a second phase of the filtered time domain digital signal to a second phase of the frequency domain data, wherein at each stage, the first channel circuit and the second channel share the butterfly circuit associated with that stage. In some such cases, the FFT circuit comprises five serially cascaded processing stages, the processing stages including a 64-point stage, a 128-point stage, a 256-point stage, a 512-point stage, and a 1024 point stage. In some such cases, the channelizer comprises: a two phase reorder circuit configured to split the filtered time domain digital signal into the first phase of the filtered time domain digital signal and the second phase of the filtered time domain digital signal; and a two phase merge circuit configured to merge the first phase of the frequency domain data with the second phase of the frequency domain data to generate the output frequency domain data. In some such cases, the number of frequency bins is dynamically programmable to one of 64, 128, 256, 512, or 1024, and the number of folds of the polyphase filter is dynamically programmable in the range of one to seven, and the channelizer output frequency domain data is organized into frames, the frames of length proportional to the number of frequency bins. In some cases, the ADC and the channelizer are implemented in an application specific integrated circuit.

Another example embodiment of the present disclosure provides a method for signal channelizing, the method comprising: filtering time domain input data using a polyphase filter configured to control spectral shaping of channelized output frequency bins, wherein filter coefficients and a number of folds of the polyphase filter are dynamically programmable; and transforming the filtered time domain input data using a fast Fourier transform (FFT) circuit configured to output frequency domain data distributed into the frequency bins, wherein a number of the frequency bins is dynamically programmable.

In some cases, the number of frequency bins is dynamically programmable to one of 64, 128, 256, 512, or 1024, and the number of folds of the polyphase filter is dynamically programmable in the range of one to seven. In some cases, the channelizer output frequency domain data is organized into frames, the frames of length proportional to the number of frequency bins.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A reconfigurable channelizer comprising:

a polyphase filter circuit configured to filter time domain input data to control spectral shaping of frequency bins of the reconfigurable channelizer's output, wherein filter coefficients and a quantity of folds of the polyphase filter circuit are dynamically programmable;

a fast Fourier transform (FFT) circuit configured to transform the filtered time domain input data to output frequency domain data distributed into the frequency bins, wherein a quantity of the frequency bins is dynamically programmable;

wherein the FFT circuit comprises:

a sample reorder circuit and two or more serially cascaded processing stages, each stage comprising a butterfly circuit configured to compute an N-point FFT butterfly, where N increases by a factor of two for each stage;

a first channel circuit configured to transform a first phase of the filtered time domain input data to a first phase of the frequency domain data; and a second channel circuit configured to transform a second phase of the filtered time domain input data to a second phase of the frequency domain data, wherein at each stage, the first channel circuit and the second channel circuit share the butterfly circuit associated with that stage.

2. The reconfigurable channelizer of claim 1, wherein the FFT circuit is employed to implement an inverse fast Fourier transform.

3. The reconfigurable channelizer of claim 1, wherein the FFT circuit comprises five serially cascaded processing stages, the five serially cascaded processing stages including a 64-point stage, a 128-point stage, a 256-point stage, a 512-point stage, and a 1024 point stage.

4. The reconfigurable channelizer of claim 1, wherein the reconfigurable channelizer comprises a two phase reorder circuit configured to split the filtered time domain input data into the first phase of the filtered time domain input data and the second phase of the filtered time domain input data.

5. The reconfigurable channelizer of claim 1, wherein the reconfigurable channelizer comprises a two phase merge circuit configured to merge the first phase of the frequency domain data with the second phase of the frequency domain data to generate the output frequency domain data.

6. The reconfigurable channelizer of claim 1, wherein the polyphase filter circuit comprises a crossbar circuit configured to align the time domain input data with the filter coefficients and a multiply circuit configured to multiply the aligned time domain input data with the filter coefficients.

7. The reconfigurable channelizer of claim 1, wherein the reconfigurable channelizer is configured to generate the frequency bins for output at a rate equal to two times a frequency spacing between the frequency bins.

8. The reconfigurable channelizer of claim 1, wherein the quantity of the frequency bins is dynamically programmable to one of 64, 128, 256, 512, or 1024, and the quantity of folds of the polyphase filter circuit is dynamically programmable in a range of one to seven.

9. The reconfigurable channelizer of claim 1, wherein the reconfigurable channelizer output frequency domain data is organized into frames, the frames of length proportional to the quantity of the frequency bins.

10. The reconfigurable channelizer of claim 1, wherein the reconfigurable channelizer is implemented in an application specific integrated circuit.

11. A receiver comprising:

an analog to digital converter (ADC) configured to convert a received analog signal to a time domain digital signal; and a reconfigurable channelizer configured to convert the time domain digital signal to output frequency domain data distributed into a quantity of frequency bins of the reconfigurable channelizer's output, the reconfigurable channelizer including a polyphase filter circuit configured to filter the time domain digital signal to control spectral shaping of the frequency bins of the reconfigurable channelizer's output, wherein filter coefficients and a quantity of folds of the polyphase filter circuit are dynamically programmable, and a fast Fourier transform (FFT) circuit configured to transform the filtered time domain digital signal to the frequency domain data distributed into the frequency bins, wherein the quantity of the frequency bins is dynamically programmable;

wherein the FFT circuit comprises:

a sample reorder circuit and two or more serially cascaded processing stages, each stage comprising a butterfly circuit configured to compute an N-point FFT butterfly, where N increases by a factor of two for each stage;

a first channel circuit configured to transform a first phase of the filtered time domain digital signal to a first phase of the frequency domain data; and a second channel circuit configured to transform a second phase of the filtered time domain digital signal to a second phase of the frequency domain data, wherein at each stage, the first channel circuit and the second channel circuit share the butterfly circuit associated with that stage.

12. The receiver of claim 11, wherein the FFT circuit comprises five serially cascaded processing stages, the five serially cascaded processing stages including a 64-point stage, a 128-point stage, a 256-point stage, a 512-point stage, and a 1024 point stage.

13. The receiver of claim 11, wherein the reconfigurable channelizer comprises: a two phase reorder circuit configured to split the filtered time domain digital signal into the first phase of the filtered time domain digital signal and the second phase of the filtered time domain digital signal; and a two phase merge circuit configured to merge the first phase of the frequency domain data with the second phase of the frequency domain data to generate the output frequency domain data.

14. The receiver of claim 11, wherein the quantity of the frequency bins is dynamically programmable to one of 64, 128, 256, 512or 1024, and the quantity of folds of the polyphase filter circuit is dynamically programmable in a range of one to seven, and the reconfigurable channelizer's output frequency domain data is organized into frames, the frames of length proportional to the quantity of the frequency bins.

15. The receiver of claim 11, wherein the ADC and the reconfigurable channelizer are implemented in an application specific integrated circuit.

* * * * *